(12) United States Patent
Ramos et al.

(10) Patent No.: US 12,238,493 B2
(45) Date of Patent: Feb. 25, 2025

(54) AUDIO SIGNAL LIMITER

(71) Applicant: Sonos, Inc., Santa Barbara, CA (US)

(72) Inventors: Aurelio Ramos, Jamaica Plain, MA (US); Paul MacLean, Quincy, MA (US)

(73) Assignee: Sonos, Inc., Goleta, CA (US)

( * ) Notice: Subject to any disclaimer, the term of this patent is extended or adjusted under 35 U.S.C. 154(b) by 0 days.

(21) Appl. No.: 18/499,200

(22) Filed: Oct. 31, 2023

(65) Prior Publication Data

US 2024/0179464 A1 May 30, 2024

Related U.S. Application Data

(63) Continuation of application No. 17/710,388, filed on Mar. 31, 2022, now Pat. No. 11,812,241, which is a continuation of application No. 17/063,189, filed on Oct. 5, 2020, now Pat. No. 11,297,433, which is a continuation of application No. 16/146,047, filed on Sep. 28, 2018, now Pat. No. 10,798,486, which is a (Continued)

(51) Int. Cl.
| | |
|---|---|
| H04R 3/14 | (2006.01) |
| H03G 5/16 | (2006.01) |
| H03G 9/02 | (2006.01) |
| H04R 3/04 | (2006.01) |
| H04R 27/00 | (2006.01) |

(52) U.S. Cl.
CPC .............. *H04R 3/14* (2013.01); *H03G 5/165* (2013.01); *H03G 9/025* (2013.01); *H04R 3/04* (2013.01); *H04R 27/00* (2013.01); *H04R 2227/003* (2013.01); *H04R 2227/005* (2013.01); *H04R 2430/01* (2013.01)

(58) Field of Classification Search
CPC . H04R 3/14; H04R 3/04; H04R 27/00; H03G 5/165; H03G 9/025
See application file for complete search history.

(56) References Cited

U.S. PATENT DOCUMENTS

| | | | |
|---|---|---|---|
| 5,440,644 A | 8/1995 | Farinelli et al. | |
| 5,761,320 A | 6/1998 | Farinelli et al. | |

(Continued)

FOREIGN PATENT DOCUMENTS

| | | | | |
|---|---|---|---|---|
| EP | 1389853 A1 | 2/2004 | | |
| GB | 2534950 A | * 8/2016 | ......... | G10L 21/0272 |

(Continued)

OTHER PUBLICATIONS

AudioTron Quick Start Guide, Version 1.0, Mar. 2001, 24 pages.

(Continued)

*Primary Examiner* — Olisa Anwah

(57) ABSTRACT

A computing device is configured to (i) receive an indication of an operational limit of a given playback device, where the given playback device is included in a group of at least two playback devices that are configured for synchronous playback of audio content, (ii) receive a first audio signal for playback by the group of at least two playback devices, (iii) based on the operational limit of the given playback device, apply a filter to the first audio signal to generate a second audio signal, and (iv) transmit the second audio signal to at least the given playback device for synchronous playback by the group of at least two playback devices.

20 Claims, 13 Drawing Sheets

Related U.S. Application Data continuation of application No. 15/858,202, filed on Dec. 29, 2017, now Pat. No. 10,123,118, which is a continuation of application No. 15/479,458, filed on Apr. 5, 2017, now Pat. No. 9,860,644.

(56) References Cited

U.S. PATENT DOCUMENTS

| | | | |
|---|---|---|---|
| 5,923,902 | A | 7/1999 | Inagaki |
| 5,970,152 | A | 10/1999 | Klayman |
| 6,032,202 | A | 2/2000 | Lea et al. |
| 6,256,554 | B1 | 7/2001 | DiLorenzo |
| 6,404,811 | B1 | 6/2002 | Cvetko et al. |
| 6,469,633 | B1 | 10/2002 | Wachter |
| 6,522,886 | B1 | 2/2003 | Youngs et al. |
| 6,611,537 | B1 | 8/2003 | Edens et al. |
| 6,631,410 | B1 | 10/2003 | Kowalski et al. |
| 6,757,517 | B2 | 6/2004 | Chang |
| 6,778,869 | B2 | 8/2004 | Champion |
| 7,130,608 | B2 | 10/2006 | Hollstrom et al. |
| 7,130,616 | B2 | 10/2006 | Janik |
| 7,143,939 | B2 | 12/2006 | Henzerling |
| 7,236,773 | B2 | 6/2007 | Thomas |
| 7,295,548 | B2 | 11/2007 | Blank et al. |
| 7,391,791 | B2 | 6/2008 | Balassanian et al. |
| 7,483,538 | B2 | 1/2009 | McCarty et al. |
| 7,571,014 | B1 | 8/2009 | Lambourne et al. |
| 7,630,501 | B2 | 12/2009 | Blank et al. |
| 7,643,894 | B2 | 1/2010 | Braithwaite et al. |
| 7,657,910 | B1 | 2/2010 | McAulay et al. |
| 7,853,341 | B2 | 12/2010 | McCarty et al. |
| 7,987,294 | B2 | 7/2011 | Bryce et al. |
| 8,014,423 | B2 | 9/2011 | Thaler et al. |
| 8,045,952 | B2 | 10/2011 | Qureshey et al. |
| 8,103,009 | B2 | 1/2012 | McCarty et al. |
| 8,234,395 | B2 | 7/2012 | Millington |
| 8,428,277 | B1 | 4/2013 | Skoglund et al. |
| 8,483,853 | B1 | 7/2013 | Lambourne |
| 8,731,215 | B2 | 5/2014 | Seefeldt et al. |
| 8,811,629 | B1 | 8/2014 | Kulavik et al. |
| 8,942,252 | B2 | 1/2015 | Balassanian et al. |
| 9,300,262 | B2 | 3/2016 | Trammell |
| 9,729,115 | B2 | 8/2017 | Kallai et al. |
| 10,149,051 | B2 | 12/2018 | Thyssen |
| 2001/0042107 | A1 | 11/2001 | Palm |
| 2002/0022453 | A1 | 2/2002 | Balog et al. |
| 2002/0026442 | A1 | 2/2002 | Lipscomb et al. |
| 2002/0124097 | A1 | 9/2002 | Isely et al. |
| 2003/0157951 | A1 | 8/2003 | Hasty, Jr. |
| 2004/0024478 | A1 | 2/2004 | Hans et al. |
| 2007/0142944 | A1 | 6/2007 | Goldberg et al. |
| 2009/0092265 | A1 | 4/2009 | Lovejoy |
| 2010/0054498 | A1 | 3/2010 | Sollenberger et al. |
| 2010/0195846 | A1 | 8/2010 | Yokoyama |
| 2010/0202631 | A1 | 8/2010 | Short |
| 2010/0208918 | A1 | 8/2010 | Noguchi |
| 2010/0313739 | A1 | 12/2010 | Lupini et al. |
| 2011/0228945 | A1 | 9/2011 | Mihelich et al. |
| 2012/0033818 | A1 | 2/2012 | De Poortere |
| 2012/0039490 | A1 | 2/2012 | Smithers |
| 2012/0328115 | A1 | 12/2012 | Wolters et al. |
| 2014/0341394 | A1* | 11/2014 | Croft, III ............. H04R 3/04 381/102 |
| 2015/0003633 | A1 | 1/2015 | Trammell |
| 2015/0030180 | A1 | 1/2015 | Sun et al. |
| 2015/0222993 | A1 | 8/2015 | Ramos et al. |
| 2015/0263690 | A1 | 9/2015 | Goto et al. |
| 2015/0332585 | A1 | 11/2015 | H.M. et al. |
| 2016/0049915 | A1 | 2/2016 | Wang et al. |
| 2016/0056787 | A1 | 2/2016 | Lu et al. |
| 2016/0219391 | A1 | 7/2016 | Ward et al. |
| 2016/0295343 | A1 | 10/2016 | Tsingos et al. |
| 2017/0006394 | A1 | 1/2017 | Risberg et al. |
| 2017/0060524 | A1 | 3/2017 | Daly |
| 2017/0085985 | A1 | 3/2017 | Kim et al. |
| 2017/0127145 | A1 | 5/2017 | Rajapakse |
| 2017/0236522 | A1 | 8/2017 | Atti et al. |
| 2018/0115824 | A1* | 4/2018 | Cassidy ............. H04R 3/007 |
| 2018/0160227 | A1* | 6/2018 | Lawrence ............ H04R 3/002 |

FOREIGN PATENT DOCUMENTS

| | | |
|---|---|---|
| WO | 200153994 | 7/2001 |
| WO | 2003093950 A2 | 11/2003 |

OTHER PUBLICATIONS

AudioTron Reference Manual, Version 3.0, May 2002, 70 pages.
AudioTron Setup Guide, Version 3.0, May 2002, 38 pages.
Bluetooth. "Specification of the Bluetooth System: The ad hoc SCATTERNET for affordable and highly functional wireless connectivity," Core, Version 1.0 A, Jul. 26, 1999, 1068 pages.
Bluetooth. "Specification of the Bluetooth System: Wireless connections made easy," Core, Version 1.0 B, Dec. 1, 1999, 1076 pages.
Dell, Inc. "Dell Digital Audio Receiver: Reference Guide," Jun. 2000, 70 pages.
Dell, Inc. "Start Here," Jun. 2000, 2 pages.
"Denon 2003-2004 Product Catalog," Denon, 2003-2004, 44 pages.
International Bureau, International Preliminary Report on Patentability, mailed on Oct. 17, 2019, issued in connection with International Application No. PCT/US2018/025928, filed on Apr. 3, 2018, 8 pages.
International Searching Authority, International Search Report and Written Opinion mailed on Jun. 21, 2018, in connection with International Application No. PCT/US2018/025928, 11 pages.
Jo et al., "Synchronized One-to-many Media Streaming with Adaptive Playout Control," Proceedings of SPIE, 2002, pp. 71-82, vol. 4861.
Jones, Stephen, "Dell Digital Audio Receiver: Digital upgrade for your analog stereo," Analog Stereo, Jun. 24, 2000 http://www.reviewsonline.com/articles/961906864.htm retrieved Jun. 18, 2014, 2 pages.
Louderback, Jim, "Affordable Audio Receiver Furnishes Homes With MP3," TechTV Vault. Jun. 28, 2000 retrieved Jul. 10, 2014, 2 pages.
Non-Final Office Action mailed Aug. 6, 2021, issued in connection with U.S. Appl. No. 17/063,189, filed Oct. 5, 2020, 9 pages.
Non-Final Office Action mailed on Apr. 5, 2023, issued in connection with U.S. Appl. No. 17/710,388, filed Mar. 31, 2022, 10 pages.
Non-Final Office Action mailed on Feb. 7, 2020, issued in connection with U.S. Appl. No. 16/146,047, filed Sep. 28, 2018, 5 pages.
Notice of Allowance mailed on Aug. 16, 2023, issued in connection with U.S. Appl. No. 17/710,388, filed Mar. 31, 2022, 5 pages.
Notice of Allowance mailed on Jul. 18, 2017, issued in connection with U.S. Appl. No. 15/479,458, filed Apr. 5, 2017, 6 pages.
Notice of Allowance mailed on May 22, 2020, issued in connection with U.S. Appl. No. 16/146,047, filed Sep. 28, 2018, 8 pages.
Notice of Allowance mailed on Jul. 24, 2018, issued in connection with U.S. Appl. No. 15/858,202, filed Dec. 29, 2017, 6 pages.
Palm, Inc., "Handbook for the Palm VII Handheld," May 2000, 311 pages.
Presentations at WinHEC 2000, May 2000, 138 pages.
United States Patent and Trademark Office, U.S. Appl. No. 60/490,768, filed Jul. 28, 2003, entitled "Method for synchronizing audio playback between multiple networked devices," 13 pages.
United States Patent and Trademark Office, U.S. Appl. No. 60/825,407, filed Sep. 12, 2006, entitled "Controlling and manipulating groupings in a multi-zone music or media system," 82 pages.
UPnP; "Universal Plug and Play Device Architecture," Jun. 8, 2000; version 1.0; Microsoft Corporation; pp. 1-54.
Yamaha DME 64 Owner's Manual; copyright 2004, 80 pages.
Yamaha DME Designer 3.5 setup manual guide; copyright 2004, 16 pages.
Yamaha DME Designer 3.5 User Manual; Copyright 2004, 507 pages.

* cited by examiner

AUDIO SIGNAL LIMITER

CROSS REFERENCE TO RELATED APPLICATIONS

This application claims priority under 35 U.S.C. § 120 to, and is a continuation of U.S. patent application Ser. No. 17/710,388, filed on Mar. 31, 2022 and entitled "Audio Signal Limiter," which is a continuation of U.S. patent application Ser. No. 17/063,189, filed on Oct. 5, 2020 and entitled "Limiter for Bass Enhancement," which is a continuation of U.S. patent application Ser. No. 16/146,047 filed on Sep. 28, 2018, now U.S. Pat. No. 10,798,486, entitled "Limiter for Bass Enhancement," which is a continuation of U.S. patent application Ser. No. 15/858,202 filed on Dec. 29, 2017, now U.S. Pat. No. 10,123,118, entitled "Limiter for Bass Enhancement," which is a continuation of U.S. patent application Ser. No. 15/479,458 filed on Apr. 5, 2017, now U.S. Pat. No. 9,860,644, entitled "Limiter for Bass Enhancement," the contents of each of which are hereby incorporated by reference in their entirety for all purposes.

FIELD OF THE DISCLOSURE

The disclosure is related to consumer goods and, more particularly, to methods, systems, products, features, services, and other elements directed to media playback or some aspect thereof.

BACKGROUND

Options for accessing and listening to digital audio in an out-loud setting were limited until 2003, when SONOS, Inc. filed for one of its first patent applications, entitled "Method for Synchronizing Audio Playback between Multiple Networked Devices," and began offering a media playback system for sale in 2005. The Sonos Wireless HiFi System enables people to experience music from many sources via one or more networked playback devices. Through a software control application installed on a smartphone, tablet, or computer, one can play what he or she wants in any room that has a networked playback device. Additionally, using the controller, for example, different songs can be streamed to each room with a playback device, rooms can be grouped together for synchronous playback, or the same song can be heard in all rooms synchronously.

Given the ever-growing interest in digital media, there continues to be a need to develop consumer-accessible technologies to further enhance the listening experience.

BRIEF DESCRIPTION OF THE DRAWINGS

Features, aspects, and advantages of the presently disclosed technology may be better understood with regard to the following description, appended claims, and accompanying drawings where:

Figure 1:
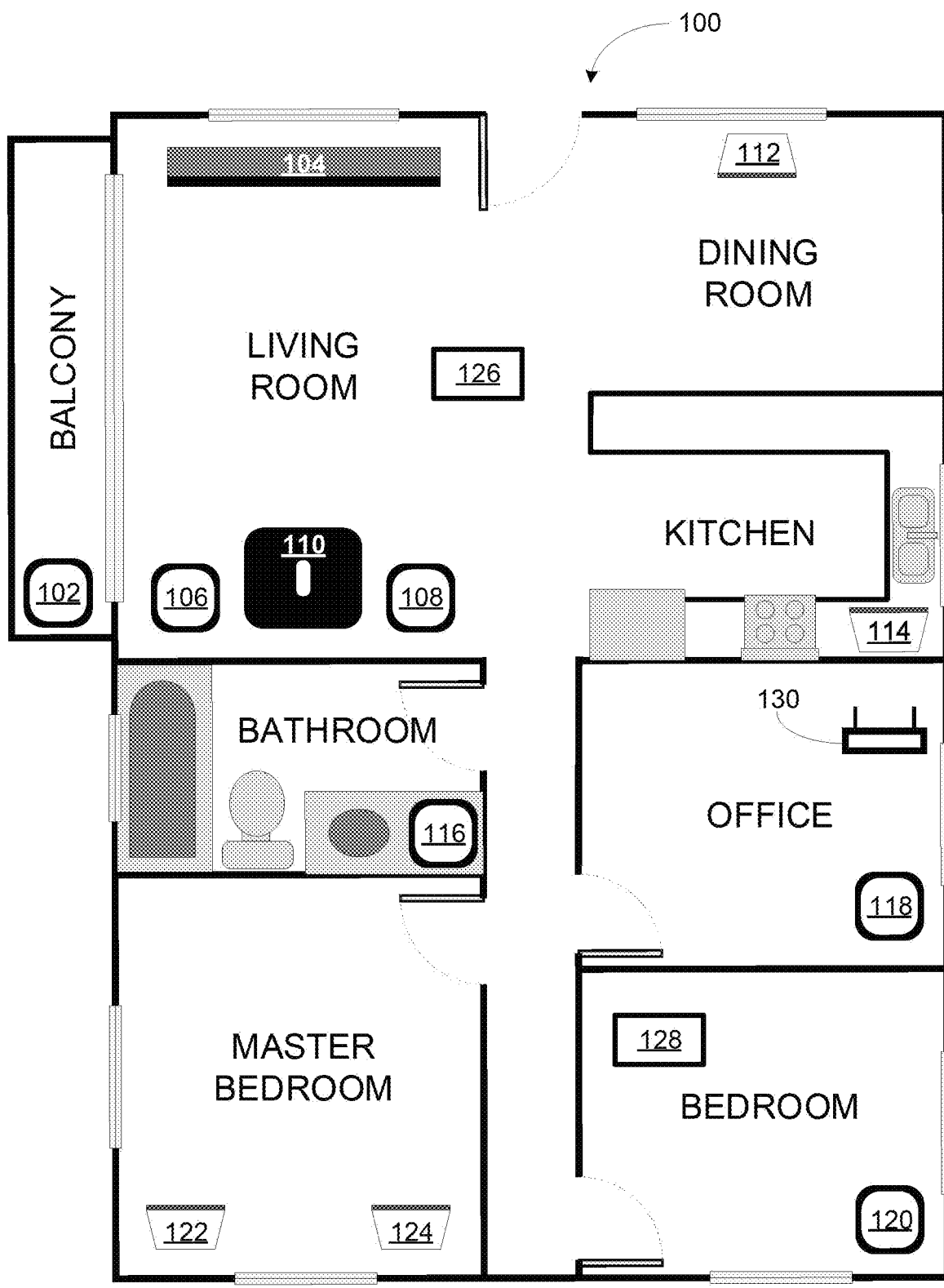
FIG. 1 shows an example media playback system configuration in which certain embodiments may be practiced.

The drawings are for purpose of illustrating example embodiments, but it is understood that the inventions are not limited to the arrangements and instrumentality shown in the drawings.

DETAILED DESCRIPTION

I. Overview

An audio signal may be input into an audio playback device and the audio playback device may output audio based on the audio signal. The audio playback device may then play audio content at different volume settings. Further, the bass may be boosted at the different volumes to correct for a natural response (EQ) of a speaker and/or acoustics of room and/or the content. A bass response of the audio playback device may be boosted by increasing a low frequency gain of the audio signal played back by the audio playback device. However, an operational limit of the audio playback device may determine whether, with bass boosting, the audio is played back without distortion and/or without damaging the audio playback device as higher volume settings are reached.

The operational limit may take a variety of forms. For example, the operational limit might include a maximum excursion of a transducer. Additionally, or alternatively, the operational limit may include voltage, current, power, and temperature limits of an audio amplifier. With bass boosting, the audio playback device could approach the operational limit before a volume setting approaches a highest volume setting. To maintain operation within the operational limit as the volume continues to be increased and maximizing perceived loudness, an amplitude of the audio signal may be limited at low frequencies to prevent the excursion and/or voltage, current, power, temperature, or any other physical parameters from exceeding the operational limit and damaging the playback device. The limiting may allow the playback device to reach higher volumes than physically permissible without distortion. The limiting may take a variety of forms applied in a variety of combinations.

In one example, the audio signal with increased gain may be passed through a series of analog limiters. The analog limiters include various analog electrical components such as capacitors, resistors, and inductors. The analog limiters may track a level of an audio signal (e.g., RMS level) in the form of an analog signal and prevent the level of the audio signal from exceeding a defined threshold. The analog limiters attenuate an amplitude of the audio signal at one or more frequencies so that the audio playback device continues to operate within its operational limit.

In another example, the audio signal with increased gain may be passed through one or more digital filters. The digital filter may take the form of a high pass filter and/or low frequency (e.g., bass) filter with gain and cutoff frequencies that change as a function of one or more of time, the audio signal, and/or a previous gain and/or cutoff frequency. The digital filter attenuates an amplitude of the audio signal at one or more frequencies so that the audio playback device continues to operate within its operational limit. Typically, this attenuation is accomplished by dynamically adjusting a threshold frequency, Q, and/or gain of a digital filter via filter coefficients of the digital filter.

In yet another example, the audio signal with increased gain may be analyzed to estimate an expected excursion. For example, the excursion may be how far a cone of the transducer travels from a resting position when an audio signal after equalization and volume gain is applied to the transducer. An excursion model may be used to estimate this expected excursion. The excursion model may take as inputs known characteristics of the transducer and the audio signal to predict the excursion. Based on the amount of excursion, a threshold frequency, Q, and/or gain of a digital filter can be adjusted so that the transducer component operates within its operational limit as the audio signal is passed through the digital filter. Other physical parameters such as power, voltage, and current can also be modeled like excursion and used to dynamically adjust the threshold frequency, Q, and/or gain of the digital filter.

In another example, components of an audio playback device may be designed to have certain mechanical properties. For example, a spider may have a certain elasticity or rigidity similar to that of a spring which cause a restorative force to be applied to the cone. The mechanical properties may prevent transducer components from being damaged. The spider may have other types of restorative properties as well.

A problem with conventional methods of maintaining operation of the audio playback devices within an operational limit is that it can produce a choppy listening experience. For example, in certain bass heavy content (e.g., acoustic content with a lot of bass such as a kick drum), the loudness of the kick drum may be inconsistent as the threshold frequency, Q, and/or gain of the digital filter dynamically changes to maintain operation of the audio playback device within the operational limit. Quieter beats of the kickdrum may be limited less whereas louder beats of the kick drum (which are expected to exceed the transducer's physical limits) may be limited more. The difference in limiting may result in the bass appearing to unnaturally cut in and out.

Embodiments described herein are directed to a limiter which reduces the choppiness associated with conventional limiting schemes. The audio playback device may operate within operational limit without producing the choppiness that would otherwise be perceivable or minimally perceivable as distortion. Also, stresses on the audio playback device may not increase.

The audio signal played by the audio playback device may take a variety of forms. In one example, the audio signal may be a digital audio signal such as a packetized or non-packetized stream of audio from a music service or television, a digital audio file, or audio signals generated by the audio playback device itself or a device connected to the audio playback device. In another example, the audio signal may be analog signal input from an auxiliary connection or a digital signal input from a USB connection. The audio signal may comprise frequency content that range from 0 Hz to 22,050 Hz or some subset of this frequency range. The audio signal may be input into one or more dynamic sidechain filters (DSF).

The DSF may store or receive from a network device an indication of an operational limit of the playback device. The indication may take the form of a threshold. In some examples, the threshold may be a performance ceiling response which defines maximum amplitudes of an audio signal input into an audio playback pipeline over a range of frequencies so that the audio playback pipeline does not exceed an operational limit. The operational limit may include various physical limits, such as electrical, mechanical, and/or thermal limits associated with the audio playback pipeline as well.

The DSF may compare an envelope of a dry signal with the threshold. The dry signal may be an audio signal after amplification to account for a volume setting but before being converted to an analog signal and amplified for output by the transducer. Additionally, or alternatively, the dry signal may be an audio signal processed by an equalizer. An output of the comparison may be a dry excess corresponding to an envelope of the dry signal in excess of the threshold. Similarly, the DSF may compare an envelope of a wet signal to the threshold. The wet signal may be the result of applying a filter to the dry audio signal. An output of the comparison may be a wet excess corresponding to an envelope of the wet signal in excess of the threshold.

The filter applied to the dry signal to produce the wet signal may be a fixed filter which filters the audio signal in a manner which is pleasing to a listener while conforming to the limits of the audio playback pipeline. The filter may take the form of a finite impulse response filter (FIR), warped FIR, infinite impulse response filter (IIR), among others. The filter may allow for operational limit to be reached most readily in the low frequencies and with minimal perception by the listener.

The wet excess and dry excess may be used to determine how much the dry and wet signals are to be mixed to maintain operation of the audio playback device within an operational limit while affecting the dry signal as little as possible. A gain for the wet signal and a gain for the dry signal may be calculated based on the wet excess and the dry excess. Then, the dry signal and wet signal may be mixed in proportion to respective gains to output a mixed signal.

The DSF may act as a limiter. In this regard, the audio playback device which plays back the mixed signal may operate within operational limits. Alternatively, the mixed signal may be input into one or more additional instances of a DSF. The two or more DSFs may be cascaded together such that an output of one DSF is an input to another DSF. Each DSF may apply a given filter such that the cascade of DSFs acts as a limiter. Properties of the given filter of each DSF and/or an order in which the filters are applied (via the cascade of DSFs) may determine properties of the limiter. An output of the cascade of DSFs may then be played back by the audio playback device.

To illustrate, an audio signal may be received by an audio playback device. The audio signal may be a digital signal sampled at a given rate and streamed to the audio playback device. Alternatively, the signal may be an analog audio signal. In some cases, the audio playback device may have performed some type of signal processing on the audio signal such as equalization to boost desired spectral content or addition of a constant gain to the audio signal for volume amplification. The DSF may take as input the audio signal and generate a dry and wet signal. The dry and wet signals may be mixed in proportion in various frequency bands. For example, the wet signal may be 2 dB (avg.) below a performance ceiling response which takes the form of an excursion threshold in the 30-50 Hz band. The dry signal may be 10 dB above the excursion threshold in the frequency band. This means that the dry signal which is 10 dB above the excursion threshold may need to be reduced by 8 dB for an audio signal in the frequency band to exist below the threshold value, ~80% of the wet signal will be mixed with ~20% of the dry signal. The mixed signal output by the DSF may then be played back or input into cascade of two or more DSFs which output a mixed signal. The mixed signal from the DSF or cascade of DSFs may prevent the audio playback device from exceeding an operational limit, which would otherwise happen if the audio signal was not processed by the described DSF or cascade of DSFs.

Moving on from the above illustration, an example embodiment may be a playback device comprising a processor; memory; and computer instructions stored in the memory and executable by the processor to cause the processor to receive a first audio signal; compare an envelope of the first audio signal to a threshold to determine a first excess indicative of an amount by which the envelope of the first audio signal exceeds the threshold; apply a filter to the first audio signal to generate a second audio signal; compare an envelope of the second audio signal to the threshold to determine a second excess indicative of an amount by which the envelope of the second audio signal exceeds the threshold; based on the first excess and the second excess, determine a first gain associated with the first audio signal and a second gain associated with the second audio signal; mix the first audio signal and the second audio signal based on the first gain and the second gain to output a mixed signal; and cause play back of audio based on the mixed signal.

Applying the filter to the first audio signal to generate the second audio signal may comprise attenuating an amplitude of the first audio signal in a frequency range. Applying the filter to the first audio signal to generate the second audio signal may further comprise boosting an amplitude of the first audio signal outside of the frequency range. The frequency range may be within a 0 to 100 Hz range. The playback device may further comprise computer instructions for determining the envelope of the first audio signal and the second audio signal. The threshold of the playback device may be associated with an operational limit which over which damage to the playback device may occur. The playback device may further comprise computer instructions for selecting the filter based on a frequency range played back by the playback device. Applying a filter to the first audio signal to generate a second audio signal may comprise applying the filter to a first band of the first audio signal and then applying the filter to a second band of the first audio signal, where the first band and second band are non-overlapping frequency bands. The computer instructions stored in the memory and executable by the processor may define a DSF. Causing the play back of audio based on the mixed signal may comprise inputting the mixed signal to a second DSF different from the first DSF.

Another example embodiment may be a method comprising receiving a first audio signal; comparing an envelope of the first audio signal to a threshold to determine a first excess indicative of an amount by which the envelope of the first audio signal exceeds the threshold; applying a filter to the first audio signal to generate a second audio signal; comparing an envelope of the second audio signal to the threshold to determine a second excess indicative of an amount by which the envelope of the second audio signal exceeds the threshold; based on the first excess and the second excess, determining a first gain associated with the first audio signal and a second gain associated with the second audio signal; mixing the first audio signal and the second audio signal based on the first gain and the second gain to output a mixed signal; and playing back audio based on the mixed signal.

Applying the filter to the first audio signal to generate the second audio signal may comprise attenuating an amplitude of the first audio signal in a frequency range. Applying the filter to the first audio signal to generate the second audio signal may comprise boosting an amplitude of the first audio signal outside of the frequency range. The frequency range may be within a 0 to 100 Hz range. The first excess and the second excess may be positive or negative. The method may further comprise selecting the filter based on a frequency range played back by the playback device. Applying a filter to the first audio signal to generate a second audio signal may comprise applying the filter to a first band of the first audio signal and then applying the filter to a second band of the first audio signal, where the first band and second band are non-overlapping frequency bands.

Yet another example embodiment may be a tangible non-transitory computer readable storage medium including instructions for execution by a processor, the instructions, when executed, cause the processor to implement a method comprising receiving a first audio signal; comparing an envelope of the first audio signal to a threshold to determine a first excess indicative of an amount by which the envelope of the first audio signal exceeds the threshold; applying a filter to the first audio signal to generate a second audio signal; comparing an envelope of the second audio signal to the threshold to determine a second excess indicative of an amount by which the envelope of the second audio signal exceeds the threshold; based on the first excess and the second excess, determining a first gain associated with the first audio signal and a second gain associated with the second audio signal; mixing the first audio signal and the second audio signal based on the first gain and the second gain to output a mixed signal; and playing back audio based on the mixed signal.

Applying the filter to the first audio signal to generate the second audio signal may comprise attenuating an amplitude of the first audio signal in a frequency range. Applying the filter to the first audio signal to generate the second audio signal may comprise boosting an amplitude of the first audio signal outside of the frequency range. The frequency range may be within a 0 to 100 Hz range.

While some examples described herein may refer to functions performed by given actors such as "users" and/or other entities, it should be understood that this is for purposes of explanation only. The claims should not be interpreted to require action by any such example actor unless explicitly required by the language of the claims themselves. It will be understood by one of ordinary skill in the art that this disclosure includes numerous other embodiments. Moreover, the examples described herein may extend to a multitude of embodiments formed by combining the example features in any suitable manner.

II. Example Operating Environment

FIG. 1 shows an example configuration of a media playback system 100 in which one or more embodiments disclosed herein may be practiced or implemented. The media playback system 100 as shown is associated with an example home environment having several rooms and spaces, such as for example, a master bedroom, an office, a dining room, and a living room. As shown in the example of FIG. 1, the media playback system 100 includes playback devices 102-124, control devices 126 and 128, and a wired or wireless network router 130.

Further discussions relating to the different components of the example media playback system 100 and how the different components may interact to provide a user with a media experience may be found in the following sections. While discussions herein may generally refer to the example media playback system 100, technologies described herein are not limited to applications within, among other things, the home environment as shown in FIG. 1. For instance, the technologies described herein may be useful in environments where multi-zone audio may be desired, such as, for example, a commercial setting like a restaurant, mall or airport, a vehicle like a sports utility vehicle (SUV), bus or car, a ship or boat, an airplane, and so on.

a. Example Playback Devices

Figure 2:
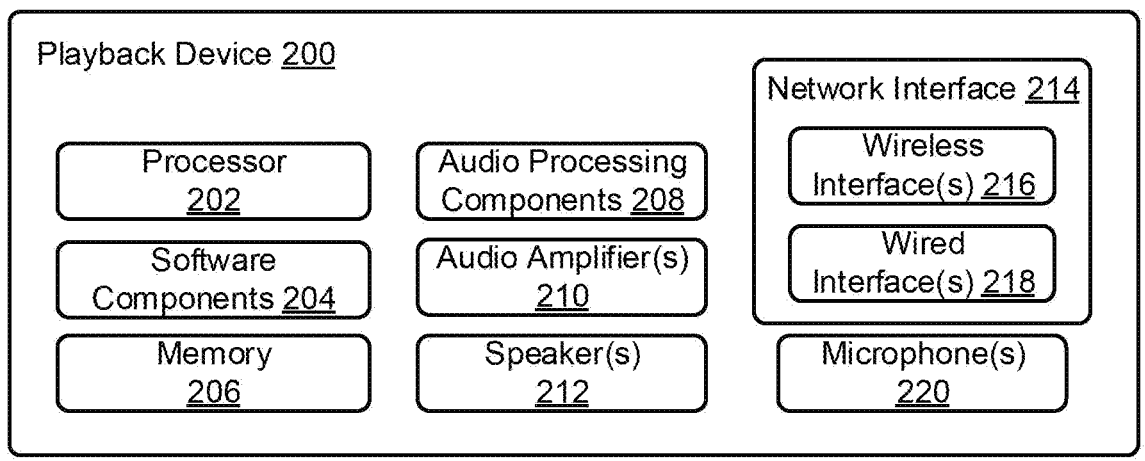
FIG. 2 shows a functional block diagram of an example playback device.

FIG. 2 shows a functional block diagram of an example playback device 200 that may be configured to be one or more of the playback devices 102-124 of the media playback system 100 of FIG. 1. The playback device 200 may include a processor 202, software components 204, memory 206, audio processing components 208, audio amplifier(s) 210, speaker(s) 212, a network interface 214 including wireless interface(s) 216 and wired interface(s) 218, and microphone(s) 220. In one case, the playback device 200 may not include the speaker(s) 212, but rather a speaker interface for connecting the playback device 200 to external speakers. In another case, the playback device 200 may include neither the speaker(s) 212 nor the audio amplifier(s) 210, but rather an audio interface for connecting the playback device 200 to an external audio amplifier or audio-visual receiver.

In one example, the processor 202 may be a clock-driven computing component configured to process input data according to instructions stored in the memory 206. The memory 206 may be a tangible computer-readable medium configured to store instructions executable by the processor 202. For instance, the memory 206 may be data storage that can be loaded with one or more of the software components 204 executable by the processor 202 to achieve certain functions. In one example, the functions may involve the playback device 200 retrieving audio data from an audio source or another playback device. In another example, the functions may involve the playback device 200 sending audio data to another device or playback device on a network. In yet another example, the functions may involve pairing of the playback device 200 with one or more playback devices to create a multi-channel audio environment.

Certain functions may involve the playback device 200 synchronizing playback of audio content with one or more other playback devices. During synchronous playback, a listener will preferably not be able to perceive time-delay differences between playback of the audio content by the playback device 200 and the one or more other playback devices. U.S. Pat. No. 8,234,395 entitled, "System and method for synchronizing operations among a plurality of independently clocked digital data processing devices," which is hereby incorporated by reference, provides in more detail some examples for audio playback synchronization among playback devices.

The memory 206 may further be configured to store data associated with the playback device 200, such as one or more zones and/or zone groups the playback device 200 is a part of, audio sources accessible by the playback device 200, or a playback queue that the playback device 200 (or some other playback device) may be associated with. The data may be stored as one or more state variables that are periodically updated and used to describe the state of the playback device 200. The memory 206 may also include the data associated with the state of the other devices of the media system, and shared from time to time among the devices so that one or more of the devices have the most recent data associated with the system. Other embodiments are also possible.

The audio processing components 208 may include one or more digital-to-analog converters (DAC), an audio preprocessing component, an audio enhancement component or a digital signal processor (DSP), and so on. In one embodiment, one or more of the audio processing components 208 may be a subcomponent of the processor 202. In one example, audio content may be processed and/or intentionally altered by the audio processing components 208 to produce audio signals. The produced audio signals may then be provided to the audio amplifier(s) 210 for amplification and playback through speaker(s) 212. Particularly, the audio amplifier(s) 210 may include devices configured to amplify audio signals to a level for driving one or more of the speakers 212. The speaker(s) 212 may include an individual transducer (e.g., a "driver") or a complete speaker system involving an enclosure with one or more drivers. A particular driver of the speaker(s) 212 may include, for example, a subwoofer (e.g., for low frequencies), a mid-range driver (e.g., for middle frequencies), and/or a tweeter (e.g., for high frequencies). In some cases, each transducer in the one or more speakers 212 may be driven by an individual corresponding audio amplifier of the audio amplifier(s) 210. In addition to producing analog signals for playback by the playback device 200, the audio processing components 208 may be configured to process audio content to be sent to one or more other playback devices for playback.

Audio content to be processed and/or played back by the playback device 200 may be received from an external source, such as via an audio line-in input connection (e.g., an auto-detecting 3.5 mm audio line-in connection) or the network interface 214.

The network interface 214 may be configured to facilitate a data flow between the playback device 200 and one or more other devices on a data network. As such, the playback device 200 may be configured to receive audio content over the data network from one or more other playback devices in communication with the playback device 200, network devices within a local area network, or audio content sources over a wide area network such as the Internet. In one example, the audio content and other signals transmitted and received by the playback device 200 may be transmitted in the form of digital packet data containing an Internet Protocol (IP)-based source address and IP-based destination addresses. In such a case, the network interface 214 may be configured to parse the digital packet data such that the data destined for the playback device 200 is properly received and processed by the playback device 200.

As shown, the network interface 214 may include wireless interface(s) 216 and wired interface(s) 218. The wireless interface(s) 216 may provide network interface functions for the playback device 200 to wirelessly communicate with other devices (e.g., other playback device(s), speaker(s), receiver(s), network device(s), control device(s) within a data network the playback device 200 is associated with) in accordance with a communication protocol (e.g., any wireless standard including IEEE 802.11a, 802.11b, 802.11g, 802.11n, 802.11ac, 802.15, 4G mobile communication standard, and so on). The wired interface(s) 218 may provide network interface functions for the playback device 200 to communicate over a wired connection with other devices in accordance with a communication protocol (e.g., IEEE 802.3). While the network interface 214 shown in FIG. 2 includes both wireless interface(s) 216 and wired interface(s) 218, the network interface 214 may in some embodiments include only wireless interface(s) or only wired interface(s).

The microphone(s) 220 may be arranged to detect sound in the environment of the playback device 200. For instance, the microphone(s) may be mounted on an exterior wall of a housing of the playback device. The microphone(s) may be any type of microphone now known or later developed such as a condenser microphone, electret condenser microphone, or a dynamic microphone. The microphone(s) may be sensitive to a portion of the frequency range of the speaker(s) 220. One or more of the speaker(s) 220 may operate in reverse as the microphone(s) 220. In some aspects, the playback device 200 might not include the microphone(s) 220.

In one example, the playback device 200 and one other playback device may be paired to play two separate audio components of audio content. For instance, playback device 200 may be configured to play a left channel audio component, while the other playback device may be configured to play a right channel audio component, thereby producing or enhancing a stereo effect of the audio content. The paired playback devices (also referred to as "bonded playback devices") may further play audio content in synchrony with other playback devices.

In another example, the playback device 200 may be sonically consolidated with one or more other playback devices to form a single, consolidated playback device. A consolidated playback device may be configured to process and reproduce sound differently than an unconsolidated playback device or playback devices that are paired, because a consolidated playback device may have additional speaker drivers through which audio content may be rendered. For instance, if the playback device 200 is a playback device designed to render low frequency range audio content (i.e. a subwoofer), the playback device 200 may be consolidated with a playback device designed to render full frequency range audio content. In such a case, the full frequency range playback device, when consolidated with the low frequency playback device 200, may be configured to render only the mid and high frequency components of audio content, while the low frequency range playback device 200 renders the low frequency component of the audio content. The consolidated playback device may further be paired with a single playback device or yet another consolidated playback device.

By way of illustration, SONOS, Inc. presently offers (or has offered) for sale certain devices including a "PLAY:1," "PLAY:3," "PLAY:5," "PLAYBAR," playback "CONNECT:AMP," "CONNECT," and "SUB." Any other past, present, and/or future playback devices may additionally or alternatively be used to implement the playback devices of example embodiments disclosed herein. Additionally, it is understood that a playback device is not limited to the example illustrated in FIG. 2 or to the SONOS product offerings. For example, a playback device may include a wired or wireless headphone. In another example, a playback device may include or interact with a docking station for personal mobile media playback devices. In yet another example, a playback device may be integral to another device or component such as a television, a lighting fixture, or some other device for indoor or outdoor use.

b. Example Playback Zone Configurations

Referring back to the media playback system 100 of FIG. 1, the environment may have one or more playback zones, each with one or more playback devices. The media playback system 100 may be established with one or more playback zones, after which one or more zones may be added, or removed to arrive at the example configuration shown in FIG. 1. Each zone may be given a name according to a different room or space such as an office, bathroom, master bedroom, bedroom, kitchen, dining room, living room, and/or balcony. In one case, a single playback zone may include multiple rooms or spaces. In another case, a single room or space may include multiple playback zones.

As shown in FIG. 1, the balcony, dining room, kitchen, bathroom, office, and bedroom zones each have one playback device, while the living room and master bedroom zones each have multiple playback devices. In the living room zone, playback devices 104, 106, 108, and 110 may be configured to play audio content in synchrony as individual playback devices, as one or more bonded playback devices, as one or more consolidated playback devices, or any combination thereof. Similarly, in the case of the master bedroom, playback devices 122 and 124 may be configured to play audio content in synchrony as individual playback devices, as a bonded playback device, or as a consolidated playback device.

In one example, one or more playback zones in the environment of FIG. 1 may each be playing different audio content. For instance, the user may be grilling in the balcony zone and listening to hip hop music being played by the playback device 102 while another user may be preparing food in the kitchen zone and listening to classical music being played by the playback device 114. In another example, a playback zone may play the same audio content in synchrony with another playback zone. For instance, the user may be in the office zone where the playback device 118 is playing the same rock music that is being playing by playback device 102 in the balcony zone. In such a case, playback devices 102 and 118 may be playing the rock music in synchrony such that the user may seamlessly (or at least substantially seamlessly) enjoy the audio content that is being played out-loud while moving between different playback zones. Synchronization among playback zones may be achieved in a manner similar to that of synchronization among playback devices, as described in previously referenced U.S. Pat. No. 8,234,395.

As suggested above, the zone configurations of the media playback system 100 may be dynamically modified, and in some embodiments, the media playback system 100 supports numerous configurations. For instance, if a user physically moves one or more playback devices to or from a zone, the media playback system 100 may be reconfigured to accommodate the change(s). For instance, if the user physically moves the playback device 102 from the balcony zone to the office zone, the office zone may now include both the playback device 118 and the playback device 102. The playback device 102 may be paired or grouped with the office zone and/or renamed if so desired via a control device such as the control devices 126 and 128. On the other hand, if the one or more playback devices are moved to a particular area in the home environment that is not already a playback zone, a new playback zone may be created for the particular area.

Further, different playback zones of the media playback system 100 may be dynamically combined into zone groups or split up into individual playback zones. For instance, the dining room zone and the kitchen zone 114 may be combined into a zone group for a dinner party such that playback devices 112 and 114 may render audio content in synchrony. On the other hand, the living room zone may be split into a television zone including playback device 104, and a listening zone including playback devices 106, 108, and 110, if the user wishes to listen to music in the living room space while another user wishes to watch television.

c. Example Control Devices

Figure 3:
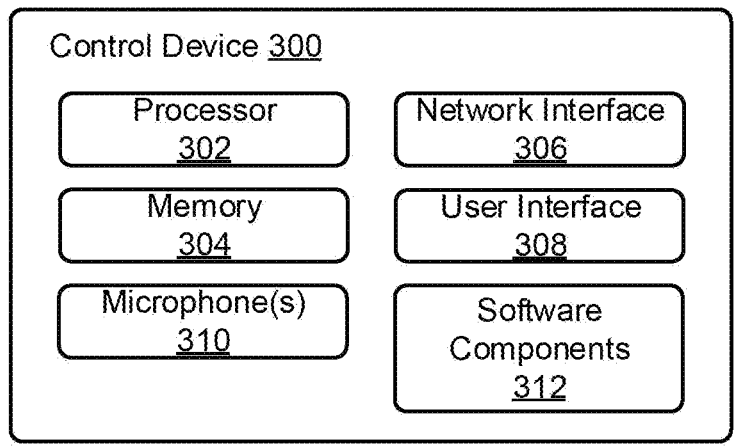
FIG. 3 shows a functional block diagram of an example control device.

FIG. 3 shows a functional block diagram of an example control device 300 that may be configured to be one or both of the control devices 126 and 128 of the media playback system 100. As shown, the control device 300 may include a processor 302, memory 304, a network interface 306, a user interface 308, microphone(s) 310, and software components 312. In one example, the control device 300 may be a dedicated controller for the media playback system 100. In another example, the control device 300 may be a network device on which media playback system controller application software may be installed, such as for example, an iPhone™ iPad™ or any other smart phone, tablet or network device (e.g., a networked computer such as a PC or Mac™).

The processor 302 may be configured to perform functions relevant to facilitating user access, control, and configuration of the media playback system 100. The memory 304 may be data storage that can be loaded with one or more of the software components executable by the processor 302 to perform those functions. The memory 304 may also be configured to store the media playback system controller application software and other data associated with the media playback system 100 and the user.

In one example, the network interface 306 may be based on an industry standard (e.g., infrared, radio, wired standards including IEEE 802.3, wireless standards including IEEE 802.11a, 802.11b, 802.11g, 802.11n, 802.11ac, 802.15, 4G mobile communication standard, and so on). The network interface 306 may provide a means for the control device 300 to communicate with other devices in the media playback system 100. In one example, data and information (e.g., such as a state variable) may be communicated between control device 300 and other devices via the network interface 306. For instance, playback zone and zone group configurations in the media playback system 100 may be received by the control device 300 from a playback device or another network device, or transmitted by the control device 300 to another playback device or network device via the network interface 306. In some cases, the other network device may be another control device.

Playback device control commands such as volume control and audio playback control may also be communicated from the control device 300 to a playback device via the network interface 306. As suggested above, changes to configurations of the media playback system 100 may also be performed by a user using the control device 300. The configuration changes may include adding/removing one or more playback devices to/from a zone, adding/removing one or more zones to/from a zone group, forming a bonded or consolidated player, separating one or more playback devices from a bonded or consolidated player, among others. Accordingly, the control device 300 may sometimes be referred to as a controller, whether the control device 300 is a dedicated controller or a network device on which media playback system controller application software is installed.

Control device 300 may include microphone(s) 310. Microphone(s) 310 may be arranged to detect sound in the environment of the control device 300. Microphone(s) 310 may be any type of microphone now known or later developed such as a condenser microphone, electret condenser microphone, or a dynamic microphone. The microphone(s) may be sensitive to a portion of a frequency range. Two or more microphones 310 may be arranged to capture location information of an audio source (e.g., voice, audible sound) and/or to assist in filtering background noise.

Figure 4:
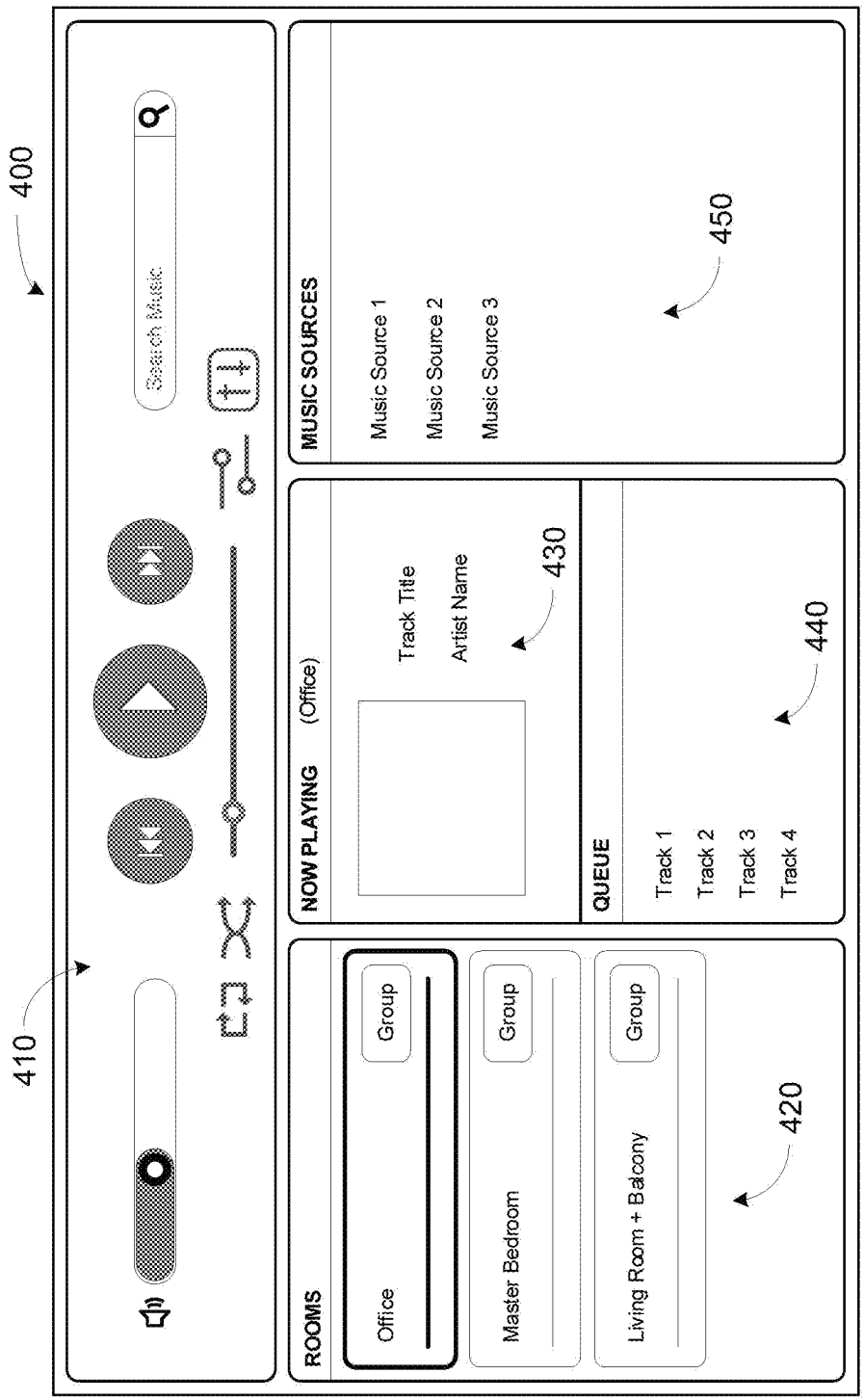
FIG. 4 shows an example controller interface.

The user interface 308 of the control device 300 may be configured to facilitate user access and control of the media playback system 100, by providing a controller interface such as the controller interface 400 shown in FIG. 4. The controller interface 400 includes a playback control region 410, a playback zone region 420, a playback status region 430, a playback queue region 440, and an audio content sources region 450. The user interface 400 as shown is just one example of a user interface that may be provided on a network device such as the control device 300 of FIG. 3 (and/or the control devices 126 and 128 of FIG. 1) and accessed by users to control a media playback system such as the media playback system 100. Other user interfaces of varying formats, styles, and interactive sequences may alternatively be implemented on one or more network devices to provide comparable control access to a media playback system.

The playback control region 410 may include selectable (e.g., by way of touch or by using a cursor) icons to cause playback devices in a selected playback zone or zone group to play or pause, fast forward, rewind, skip to next, skip to previous, enter/exit shuffle mode, enter/exit repeat mode, enter/exit cross fade mode. The playback control region 410 may also include selectable icons to modify equalization settings, and playback volume, among other possibilities.

The playback zone region 420 may include representations of playback zones within the media playback system 100. In some embodiments, the graphical representations of playback zones may be selectable to bring up additional selectable icons to manage or configure the playback zones in the media playback system, such as a creation of bonded zones, creation of zone groups, separation of zone groups, and renaming of zone groups, among other possibilities.

For example, as shown, a "group" icon may be provided within each of the graphical representations of playback zones. The "group" icon provided within a graphical representation of a particular zone may be selectable to bring up options to select one or more other zones in the media playback system to be grouped with the particular zone. Once grouped, playback devices in the zones that have been grouped with the particular zone will be configured to play audio content in synchrony with the playback device(s) in the particular zone. Analogously, a "group" icon may be provided within a graphical representation of a zone group. In this case, the "group" icon may be selectable to bring up options to deselect one or more zones in the zone group to be removed from the zone group. Other interactions and implementations for grouping and ungrouping zones via a user interface such as the user interface 400 are also possible. The representations of playback zones in the playback zone region 420 may be dynamically updated as playback zone or zone group configurations are modified.

The playback status region 430 may include graphical representations of audio content that is presently being played, previously played, or scheduled to play next in the selected playback zone or zone group. The selected playback zone or zone group may be visually distinguished on the user interface, such as within the playback zone region 420 and/or the playback status region 430. The graphical representations may include track title, artist name, album name, album year, track length, and other relevant information that may be useful for the user to know when controlling the media playback system via the user interface 400.

The playback queue region 440 may include graphical representations of audio content in a playback queue associated with the selected playback zone or zone group. In some embodiments, each playback zone or zone group may be associated with a playback queue containing information corresponding to zero or more audio items for playback by the playback zone or zone group. For instance, each audio item in the playback queue may comprise a uniform resource identifier (URI), a uniform resource locator (URL) or some other identifier that may be used by a playback device in the playback zone or zone group to find and/or retrieve the audio item from a local audio content source or a networked audio content source, possibly for playback by the playback device.

In one example, a playlist may be added to a playback queue, in which case information corresponding to each audio item in the playlist may be added to the playback queue. In another example, audio items in a playback queue may be saved as a playlist. In a further example, a playback queue may be empty, or populated but "not in use" when the playback zone or zone group is playing continuously streaming audio content, such as Internet radio that may continue to play until otherwise stopped, rather than discrete audio items that have playback durations. In an alternative embodiment, a playback queue can include Internet radio and/or other streaming audio content items and be "in use" when the playback zone or zone group is playing those items. Other examples are also possible.

When playback zones or zone groups are "grouped" or "ungrouped," playback queues associated with the affected playback zones or zone groups may be cleared or re-associated. For example, if a first playback zone including a first playback queue is grouped with a second playback zone including a second playback queue, the established zone group may have an associated playback queue that is initially empty, that contains audio items from the first playback queue (such as if the second playback zone was added to the first playback zone), that contains audio items from the second playback queue (such as if the first playback zone was added to the second playback zone), or a combination of audio items from both the first and second playback queues. Subsequently, if the established zone group is ungrouped, the resulting first playback zone may be re-associated with the previous first playback queue, or be associated with a new playback queue that is empty or contains audio items from the playback queue associated with the established zone group before the established zone group was ungrouped. Similarly, the resulting second playback zone may be re-associated with the previous second playback queue, or be associated with a new playback queue that is empty, or contains audio items from the playback queue associated with the established zone group before the established zone group was ungrouped. Other examples are also possible.

Referring back to the user interface 400 of FIG. 4, the graphical representations of audio content in the playback queue region 440 may include track titles, artist names, track lengths, and other relevant information associated with the audio content in the playback queue. In one example, graphical representations of audio content may be selectable to bring up additional selectable icons to manage and/or manipulate the playback queue and/or audio content represented in the playback queue. For instance, a represented audio content may be removed from the playback queue, moved to a different position within the playback queue, or selected to be played immediately, or after any currently playing audio content, among other possibilities. A playback queue associated with a playback zone or zone group may be stored in a memory on one or more playback devices in the playback zone or zone group, on a playback device that is not in the playback zone or zone group, and/or some other designated device.

The audio content sources region 450 may include graphical representations of selectable audio content sources from which audio content may be retrieved and played by the selected playback zone or zone group. Discussions pertaining to audio content sources may be found in the following section.

d. Example Audio Content Sources

As indicated previously, one or more playback devices in a zone or zone group may be configured to retrieve for playback audio content (e.g. according to a corresponding URI or URL for the audio content) from a variety of available audio content sources. In one example, audio content may be retrieved by a playback device directly from a corresponding audio content source (e.g., a line-in connection). In another example, audio content may be provided to a playback device over a network via one or more other playback devices or network devices.

Example audio content sources may include a memory of one or more playback devices in a media playback system such as the media playback system 100 of FIG. 1, local music libraries on one or more network devices (such as a control device, a network-enabled personal computer, or a networked-attached storage (NAS), for example), streaming audio services providing audio content via the Internet (e.g., the cloud), or audio sources connected to the media playback system via a line-in input connection on a playback device or network devise, among other possibilities.

In some embodiments, audio content sources may be regularly added or removed from a media playback system such as the media playback system 100 of FIG. 1. In one example, an indexing of audio items may be performed whenever one or more audio content sources are added, removed or updated. Indexing of audio items may involve scanning for identifiable audio items in all folders/directory shared over a network accessible by playback devices in the media playback system, and generating or updating an audio content database containing metadata (e.g., title, artist, album, track length, among others) and other associated information, such as a URI or URL for each identifiable audio item found. Other examples for managing and maintaining audio content sources may also be possible.

The above discussions relating to playback devices, controller devices, playback zone configurations, and media content sources provide only some examples of operating environments within which functions and methods described below may be implemented. Other operating environments and configurations of media playback systems, playback devices, and network devices not explicitly described herein may also be applicable and suitable for implementation of the functions and methods.

e. Example Plurality of Networked Devices

Figure 5:
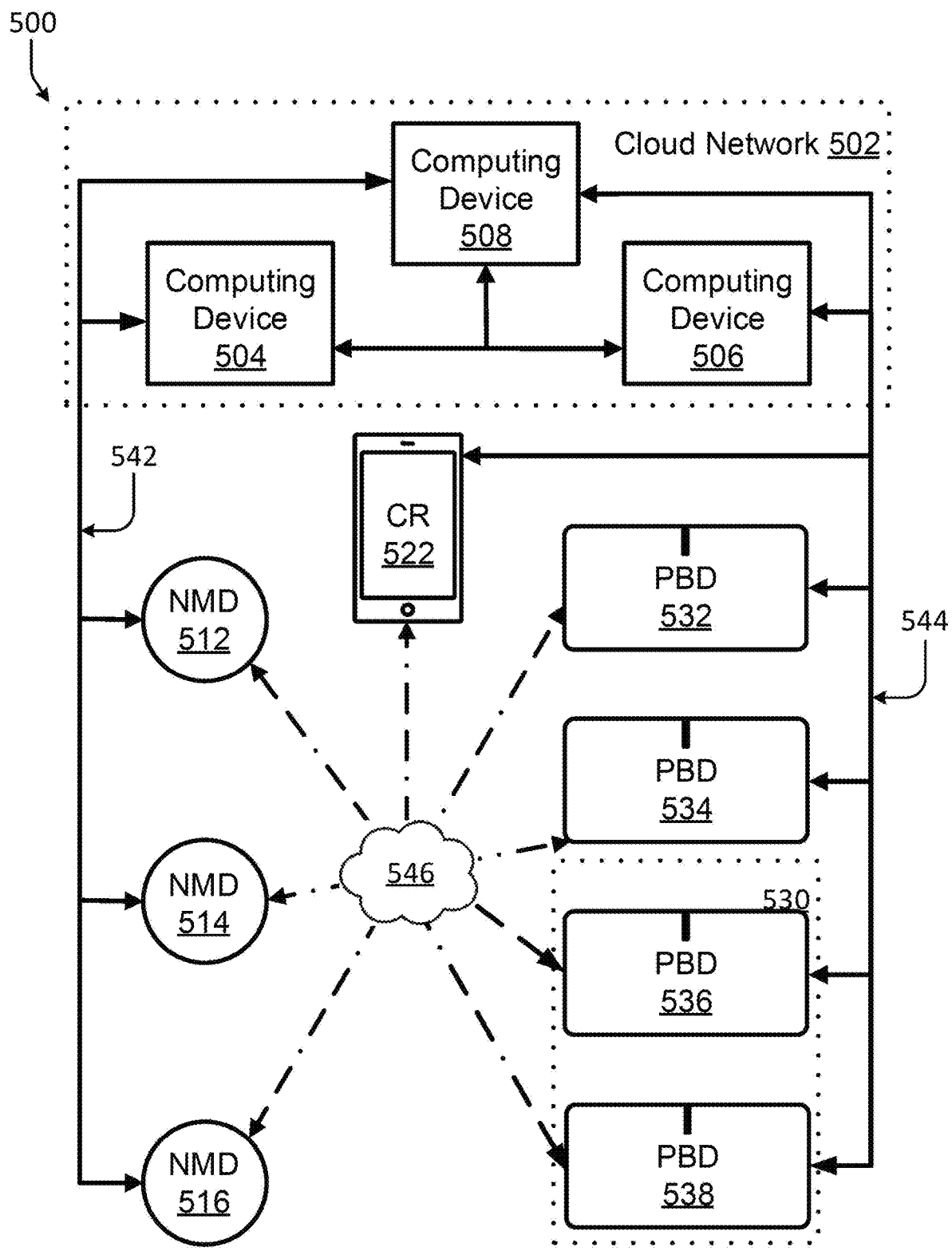
FIG. 5 shows an example plurality of network devices.

FIG. 5 shows an example plurality of devices 500 that may be configured to provide an audio playback experience based on voice control. One having ordinary skill in the art will appreciate that the devices shown in FIG. 5 are for illustrative purposes only, and variations including different and/or additional devices may be possible. As shown, the plurality of devices 500 includes computing devices 504, 506, and 508; network microphone devices (NMDs) 512, 514, and 516; playback devices (PBDs) 532, 534, 536, and 538; and a controller device (CR) 522.

Each of the plurality of devices 500 may be network-capable devices that can establish communication with one or more other devices in the plurality of devices according to one or more network protocols, such as NFC, Bluetooth, Ethernet, and IEEE 802.11, among other examples, over one or more types of networks, such as wide area networks (WAN), local area networks (LAN), and personal area networks (PAN), among other possibilities.

As shown, the computing devices 504, 506, and 508 may be part of a cloud network 502. The cloud network 502 may include additional computing devices. In one example, the computing devices 504, 506, and 508 may be different servers. In another example, two or more of the computing devices 504, 506, and 508 may be modules of a single server. Analogously, each of the computing device 504, 506, and 508 may include one or more modules or servers. For ease of illustration purposes herein, each of the computing devices 504, 506, and 508 may be configured to perform particular functions within the cloud network 502. For instance, computing device 508 may be a source of audio content for a streaming music service.

As shown, the computing device 504 may be configured to interface with NMDs 512, 514, and 516 via communication path 542. NMDs 512, 514, and 516 may be components of one or more "Smart Home" systems. In one case, NMDs 512, 514, and 516 may be physically distributed throughout a household, similar to the distribution of devices shown in FIG. 1. In another case, two or more of the NMDs 512, 514, and 516 may be physically positioned within relative close proximity of one another. Communication path 542 may comprise one or more types of networks, such as a WAN including the Internet, LAN, and/or PAN, among other possibilities.

In one example, one or more of the NMDs 512, 514, and 516 may be devices configured primarily for audio detection. In another example, one or more of the NMDs 512, 514, and 516 may be components of devices having various primary utilities. For instance, as discussed above in connection to FIGS. 2 and 3, one or more of NMDs 512, 514, and 516 may be the microphone(s) 220 of playback device 200 or the microphone(s) 310 of network device 300. Further, in some cases, one or more of NMDs 512, 514, and 516 may be the playback device 200 or network device 300. In an example, one or more of NMDs 512, 514, and/or 516 may include multiple microphones arranged in a microphone array.

As shown, the computing device 506 may be configured to interface with CR 522 and PBDs 532, 534, 536, and 538 via communication path 544. In one example, CR 522 may be a network device such as the network device 200 of FIG. 2. Accordingly, CR 522 may be configured to provide the controller interface 400 of FIG. 4. Similarly, PBDs 532, 534, 536, and 538 may be playback devices such as the playback device 300 of FIG. 3. As such, PBDs 532, 534, 536, and 538 may be physically distributed throughout a household as shown in FIG. 1. For illustration purposes, PBDs 536 and 538 may be part of a bonded zone 530, while PBDs 532 and 534 may be part of their own respective zones. As described above, the PBDs 532, 534, 536, and 538 may be dynamically bonded, grouped, unbonded, and ungrouped. Communication path 544 may comprise one or more types of networks, such as a WAN including the Internet, LAN, and/or PAN, among other possibilities.

In one example, as with NMDs 512, 514, and 516, CR 522 and PBDs 532, 534, 536, and 538 may also be components of one or more "Smart Home" systems. In one case, PBDs 532, 534, 536, and 538 may be distributed throughout the same household as the NMDs 512, 514, and 516. Further, as suggested above, one or more of PBDs 532, 534, 536, and 538 may be one or more of NMDs 512, 514, and 516.

The NMDs 512, 514, and 516 may be part of a local area network, and the communication path 542 may include an access point that links the local area network of the NMDs 512, 514, and 516 to the computing device 504 over a WAN (communication path not shown). Likewise, each of the NMDs 512, 514, and 516 may communicate with each other via such an access point.

Similarly, CR 522 and PBDs 532, 534, 536, and 538 may be part of a local area network and/or a local playback network as discussed in previous sections, and the communication path 544 may include an access point that links the local area network and/or local playback network of CR 522 and PBDs 532, 534, 536, and 538 to the computing device 506 over a WAN. As such, each of the CR 522 and PBDs 532, 534, 536, and 538 may also communicate with each over such an access point.

In one example, a single access point may include communication paths 542 and 544. In an example, each of the NMDs 512, 514, and 516, CR 522, and PBDs 532, 534, 536, and 538 may access the cloud network 502 via the same access point for a household.

As shown in FIG. 5, each of the NMDs 512, 514, and 516, CR 522, and PBDs 532, 534, 536, and 538 may also directly communicate with one or more of the other devices via communication means 546. Communication means 546 as described herein may involve one or more forms of communication between the devices, according to one or more network protocols, over one or more types of networks, and/or may involve communication via one or more other network devices. For instance, communication means 546 may include one or more of for example, Bluetooth™ (IEEE 802.15), NFC, Wireless direct, and/or Proprietary wireless, among other possibilities.

In one example, CR 522 may communicate with NMD 512 over Bluetooth™, and communicate with PBD 534 over another local area network. In another example, NMD 514 may communicate with CR 522 over another local area network, and communicate with PBD 536 over Bluetooth. In a further example, each of the PBDs 532, 534, 536, and 538 may communicate with each other according to a spanning tree protocol over a local playback network, while each communicating with CR 522 over a local area network, different from the local playback network. Other examples are also possible.

In some cases, communication means between the NMDs 512, 514, and 516, CR 522, and PBDs 532, 534, 536, and 538 may change depending on types of communication between the devices, network conditions, and/or latency demands. For instance, communication means 546 may be used when NMD 516 is first introduced to the household with the PBDs 532, 534, 536, and 538. In one case, the NMD 516 may transmit identification information corresponding to the NMD 516 to PBD 538 via NFC, and PBD 538 may in response, transmit local area network information to NMD 516 via NFC (or some other form of communication). However, once NMD 516 has been configured within the household, communication means between NMD 516 and PBD 538 may change. For instance, NMD 516 may subsequently communicate with PBD 538 via communication path 542, the cloud network 502, and communication path 544. In another example, the NMDs and PBDs may never communicate via local communications means 546. In a further example, the NMDs and PBDs may communicate primarily via local communications means 546. Other examples are also possible.

In an illustrative example, NMDs 512, 514, and 516 may be configured to receive voice inputs to control PBDs 532, 534, 536, and 538. The available control commands may include any media playback system controls previously discussed, such as playback volume control, playback transport controls, music source selection, and grouping, among other possibilities. In one instance, NMD 512 may receive a voice input to control one or more of the PBDs 532, 534, 536, and 538. In response to receiving the voice input, NMD 512 may transmit via communication path 542, the voice input to computing device 504 for processing. In one example, the computing device 504 may convert the voice input to an equivalent text command, and parse the text command to identify a command. Computing device 504 may then subsequently transmit the text command to the computing device 506. In another example, the computing device 504 may convert the voice input to an equivalent text command, and then subsequently transmit the text command to the computing device 506. The computing device 506 may then parse the text command to identify one or more playback commands.

For instance, if the text command is "Play 'Track 1' by 'Artist 1' from 'Streaming Service 1' in 'Zone 1'," The computing device 506 may identify (i) a URL for "Track 1" by "Artist 1" available from "Streaming Service 1," and (ii) at least one playback device in "Zone 1." In this example, the URL for "Track 1" by "Artist 1" from "Streaming Service 1" may be a URL pointing to computing device 508, and "Zone 1" may be the bonded zone 530. As such, upon identifying the URL and one or both of PBDs 536 and 538, the computing device 506 may transmit via communication path 544 to one or both of PBDs 536 and 538, the identified URL for playback. One or both of PBDs 536 and 538 may responsively retrieve audio content from the computing device 508 according to the received URL, and begin playing "Track 1" by "Artist 1" from "Streaming Service 1."

One having ordinary skill in the art will appreciate that the above is just one illustrative example, and that other implementations are also possible. In one case, operations performed by one or more of the plurality of devices 500, as described above, may be performed by one or more other devices in the plurality of device 500. For instance, the conversion from voice input to the text command may be alternatively, partially, or wholly performed by another device or devices, such as NMD 512, computing device 506, PBD 536, and/or PBD 538. Analogously, the identification of the URL may be alternatively, partially, or wholly performed by another device or devices, such as NMD 512, computing device 504, PBD 536, and/or PBD 538.

f. Example Network Microphone Device

Figure 6:
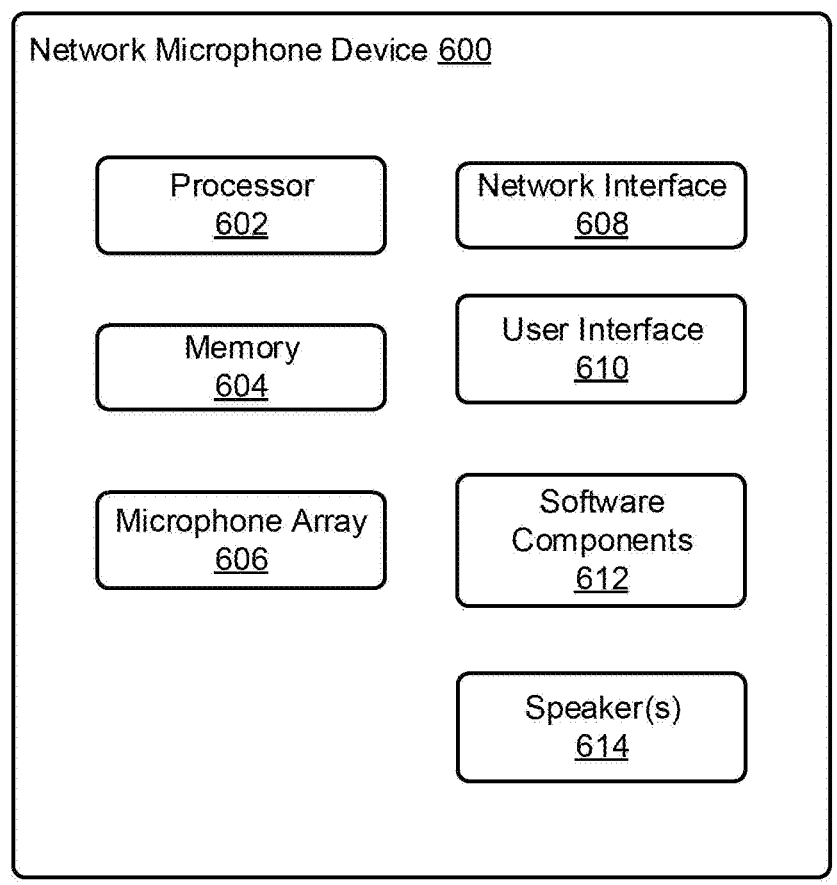
FIG. 6 shows a functional block diagram of an example network microphone device.

FIG. 6 shows a function block diagram of an example network microphone device 600 that may be configured to be one or more of NMDs 512, 514, and 516 of FIG. 5. As shown, the network microphone device 600 includes a processor 602, memory 604, a microphone array 606, a network interface 608, a user interface 610, software components 612, and speaker(s) 614. One having ordinary skill in the art will appreciate that other network microphone device configurations and arrangements are also possible. For instance, network microphone devices may alternatively exclude the speaker(s) 614 or have a single microphone instead of microphone array 606.

The processor 602 may include one or more processors and/or controllers, which may take the form of a general or special-purpose processor or controller. For instance, the processing unit 602 may include microprocessors, microcontrollers, application-specific integrated circuits, digital signal processors, and the like. The memory 604 may be data storage that can be loaded with one or more of the software components executable by the processor 602 to perform those functions. Accordingly, memory 604 may comprise one or more non-transitory computer-readable storage mediums, examples of which may include volatile storage mediums such as random access memory, registers, cache, etc. and non-volatile storage mediums such as read-only memory, a hard-disk drive, a solid-state drive, flash memory, and/or an optical-storage device, among other possibilities.

The microphone array 606 may be a plurality of microphones arranged to detect sound in the environment of the network microphone device 600. Microphone array 606 may include any type of microphone now known or later developed such as a condenser microphone, electret condenser microphone, or a dynamic microphone, among other possibilities. In one example, the microphone array may be arranged to detect audio from one or more directions relative to the network microphone device. The microphone array 606 may be sensitive to a portion of a frequency range. In one example, a first subset of the microphone array 606 may be sensitive to a first frequency range, while a second subset of the microphone array may be sensitive to a second frequency range. The microphone array 606 may further be arranged to capture location information of an audio source (e.g., voice, audible sound) and/or to assist in filtering background noise. Notably, in some embodiments the microphone array may consist of only a single microphone, rather than a plurality of microphones.

The network interface 608 may be configured to facilitate wireless and/or wired communication between various network devices, such as, in reference to FIG. 5, CR 522, PBDs 532-538, computing device 504-508 in cloud network 502, and other network microphone devices, among other possibilities. As such, network interface 608 may take any suitable form for carrying out these functions, examples of which may include an Ethernet interface, a serial bus interface (e.g., FireWire, USB 2.0, etc.), a chipset and antenna adapted to facilitate wireless communication, and/or any other interface that provides for wired and/or wireless communication. In one example, the network interface 608 may be based on an industry standard (e.g., infrared, radio, wired standards including IEEE 802.3, wireless standards including IEEE 802.11a, 802.11b, 802.11g, 802.11n, 802.11ac, 802.15, 4G mobile communication standard, and so on).

The user interface 610 of the network microphone device 600 may be configured to facilitate user interactions with the network microphone device. In one example, the user interface 608 may include one or more of physical buttons, graphical interfaces provided on touch sensitive screen(s) and/or surface(s), among other possibilities, for a user to directly provide input to the network microphone device 600. The user interface 610 may further include one or more of lights and the speaker(s) 614 to provide visual and/or audio feedback to a user. In one example, the network microphone device 600 may further be configured to playback audio content via the speaker(s) 614. In this case, the NMD 600 may also include the functions and features associated with the playback device 200.

III. Example Systems and Methods for Bass Enhancement

An audio playback device may play audio content at different volume settings. An audio signal may be input into the audio playback device and the audio playback device may output audio based on the audio signal.

A bass response is low frequency content of an audio signal played by the audio playback device. The low frequency content may be typically in the range of 0 to 100 Hz. The bass response may be boosted by adjusting an audio signal to be played by the audio playback device. The adjustment may take the form of increasing a gain of the low frequency content of the audio signal played by the audio playback device to boost the bass response of the playback device. Typically, the bass may be boosted at the different volumes to correct for a natural response (EQ) of a speaker and/or acoustics of room and/or the content.

The audio playback device may have a certain operational limit (e.g., mechanical, electrical, thermal) beyond which audio quality may deteriorate and/or components of the playback device might become damaged. The operational limit might include maximum movement (also referred to herein as an excursion) of a surround, spider, voice coil and cone from a rest position when an audio signal is applied to a transducer or passive radiator. For example, the operational limit of the cone may be that it cannot flex more than 0.5 cm before being damaged during playback of audio. Additionally, or alternatively, the operational limit might include voltage limits, current limits, power limits, temperature limits, and any other physical parameters associated with the audio playback device when playing audio. For example, the current shall not exceed 800 mA and the voltage shall not exceed 10 volts, otherwise the playback device may be damaged. Further, current may be controlled based on impedance in the playback device. For example, a maximum amount of current may flow in a circuit of the audio playback device when the circuit has a minimum impedance. The operational limit may specify a limiting voltage (based on knowledge of the impedance) at the minimum impedance to control current flow in the playback device when playing audio. In some instances, the minimum impedance may be determined based on a frequency of the audio signal.

Additionally, or alternatively the operational limit may be a maximum power of the audio signal input into the playback device. The power of the audio signal may impact a temperature of certain components in the transducer such as a voice coil, wire to the voice coil, glue that connects the wire to the voiced coil, and/or wire insulation. Specifically, as power of the audio signal increases, the temperature of the components in the playback device may increase. It follows that if the temperature of the components gets too high, the components of the playback device can be damaged. In this regard, defining an operational limit in terms of power may prevent such damage.

With bass boosting, the playback device may approach the operational limit before a volume setting approaches a highest volume setting. To maintain operation of the playback device within the operational limit, the audio signal to be played by the playback device can be limited to prevent the playback device from exceeding the operational limit as the volume continues to increase.

The conventional limiting methods may take a variety of forms. However, a problem with the conventional limiting methods is that it produces a choppy listening experience. For example, in certain base heavy content (e.g., acoustic content with a lot of bass such as a kick drum), the loudness of the kick drum may be inconsistent as filter characteristics, e.g., a threshold frequency, Q, and/or gain, of a digital filter applied to the audio signal are dynamically adjusted as a function of time, the audio signal, and/or a previous threshold frequency, Q, and/or gain. Quieter beats of the kickdrum may be limited less whereas louder beats of the kick drum (which are expected to exceed the transducer's physical limits) may be limited more. The difference in limiting may result in the bass appearing to unnaturally cut in and out.

Embodiments described herein are directed to a limiter for bass boosting which reduces the choppiness associated with conventional schemes for limiting the audio signal to be played by an audio playback device. The audio playback device may operate within an operational limit without needing to dynamically adjust filter characteristics that would otherwise produce the undesirable choppy audio. In this regard, any distortion may not be perceivable or minimally perceivable. Also, stresses on the audio playback device, e.g., transducer stress, may not increase.

In one embodiment, functions associated with the limiter may be implemented on the audio playback device. For example, the processor 202 of the audio playback device may perform functions associated with the described limiter. In another embodiment, functions associated with the limiter may be implemented on a controller device 300. In yet another embodiment, functions associated with the limiter may be implemented on a computing device 506-508 in the cloud network 502. For example, the audio playback device may send an audio signal to be played back to the computing device 506-508. Based on the audio signal and knowledge of an arrangement of the playback device, e.g., type of playback device, arrangement of transducers in the playback device, capabilities of the playback device, etc., the computing device may limit the audio signal and provide this signal back to the audio playback device for playback. In another embodiment, functions associated with the limiter may be implemented partially on one or more of the computing device, the audio playback device, and the controller in one or more combinations. Other variations are also possible.

Figure 7:
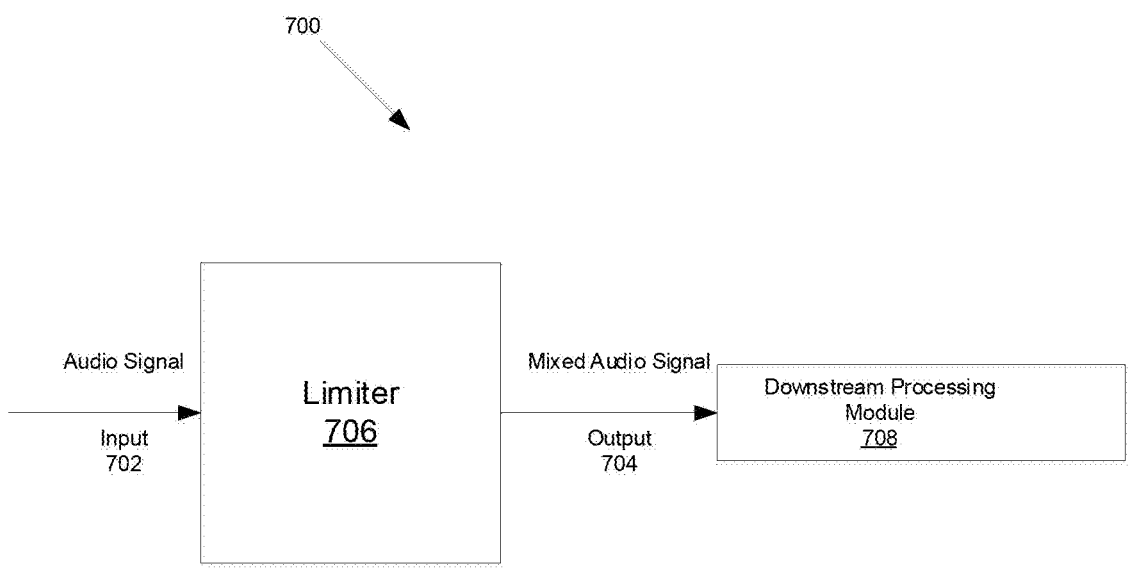
FIG. 7 shows an example input and output associated with an example limiter for an audio playback environment.

FIG. 7 shows an example arrangement 700 associated with the described limiting. The arrangement 700 may include an input 702, an output 704, a limiter 706, and an audio output pipeline 708.

The input 702 may be an audio signal. In one example, the audio signal may be a digital audio signal such as a packetized or non-packetized stream of audio from a music service or television, a digital audio file, an audio signal generated by the audio playback device itself or a device connected to the audio playback device. For example, the packet may comprise 128 bits of audio data. The limiter 706 may process one or more packets of audio data in a time domain and/or frequency domain. A sampling rate of audio data in the one or more packets and number of samples may define a frequency range of the audio processed by the limiter 706.

In another example, the audio signal may be analog signal input from an auxiliary connection or a digital signal input from a USB connection. The audio signal may comprise frequency content that may range from 0 Hz to 22,050 Hz or some subset of this frequency range.

The limiter 706 may process the audio signal to generally prevent the audio playback device from exceeding an operational limit. At the same time, the processing may not introduce choppiness in the audio playback associated with limiting bass. The limiter 706 may process one or more packets of audio data at a time. The number of packets processed by the limiter 700 at a time may depend on a frequency of the audio content defined by the audio data.

The output 704 of the limiter 706 may be a mixed audio signal. For example, the mixed audio signal may be one or more packets of audio data composed of the audio signal (e.g., dry audio signal) and a processed version of the dry signal (e.g., wet audio signal). The limiter 706 may prevent the audio playback device from generally exceeding an operational limit of the playback device or more specifically exceeding an operational limit of the audio playback pipeline 708 of the playback device. In this regard, the mixed audio signal may be input to a downstream processing module 708 to cause the playback device to play audio.

The downstream processing module 708 may be part of the audio processing pipeline include components and/or processing associated with playback of audio by audio playback device 200. For example, the downstream processing module 708 may include one or more speakers 212 and audio processing components 208. The speakers 212 may be an "active loudspeaker" (or main driver) or a passive radiator (also known as a "drone cone"). The active loudspeaker may be a conventional driver, and the passive radiator is typically the same or similar, but without a voice coil and magnet assembly. The passive radiator can be a suspended cone, not attached to a voice coil or wired to electrical circuitry and not connected to a power amplifier. The audio processing components 208 may include crossover circuits and electronic filter circuitry. The cross-over circuitry may be electronic filter circuitry used in a range of audio applications, to split up an audio signal into two or more frequency ranges, so that the signals can be sent to drivers or tweeters that are designed for different frequency ranges. Additionally, or alternatively, the downstream processing module 708 may be electronic filter circuitry which may limit audio signals, e.g., by clipping the audio signals. Still additionally, or alternatively, the downstream processing module 708 may include an audio amplifier 210 to perform equalization. The downstream processing module 708 may include other components such as a digital to analog converter (DAC) as well.

In this regard, the operational limit of the playback device may include electrical limits, mechanical limits, thermal limits, and/or other physical limits associated with functionality of the downstream processing module 708. The mechanical limits may be the excursion limits, e.g., maximum movement, of the passive radiator or the active loudspeaker. The electrical limits may include voltage and/or current limits associated with the circuitry in the audio playback pipeline 708 such as analog or digital filters. The thermal limits may include temperature limit associated with the circuitry. Other operational limits may exist as well.

Figure 8:
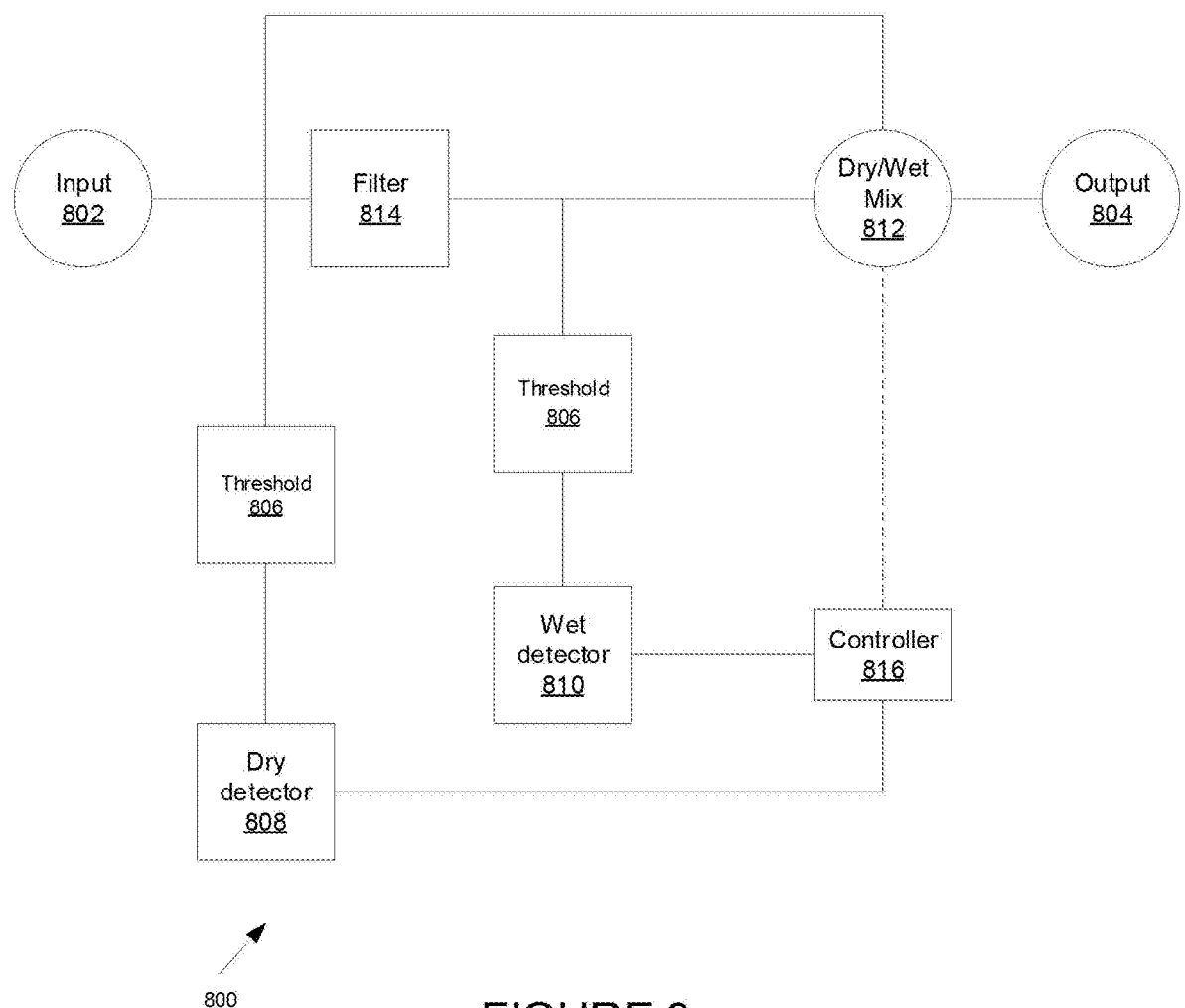
FIG. 8 shows example functions associated with an example dynamic sidechain filter for an audio playback environment.

FIG. 8 shows an example of a dynamic sidechain filter (DSF) 800. The DSF applies filtering as a "side chain" to the dry audio signal associated with the audio signal pipeline. The limiter 706 of FIG. 7 may take the form of one instance of the DSF 800 or two or more instances of the DSF 800. The two or more DSFs may be cascaded together such that an output of one DSF is an input to another DSF. The DSF 800 may have an input 802 for receiving a dry audio signal and an output 804 for outputting a signal (e.g., mixed signal) which comprises a weighted mix of the dry audio signal and a wet audio signal which is described in more detail below. The mixing of the dry and wet audio signal at different levels over time as described below makes the DSF "dynamic."

For the implementation and other processes and methods disclosed herein, the arrangement shows functionality and operation of one possible implementation of some embodiments. In this regard, each block may represent a module, a segment, or a portion of program code, which includes one or more instructions executable by a processor for implementing specific logical functions or steps in the process. The program code may be stored on any type of computer readable medium, for example, such as a storage device including a disk or hard drive. The computer readable medium may include non-transitory computer readable medium, for example, such as tangible, non-transitory computer-readable media that stores data for short periods of time like register memory, processor cache and Random Access Memory (RAM). The computer readable medium may also include non-transitory media, such as secondary or persistent long term storage, like read only memory (ROM), optical or magnetic disks, compact-disc read only memory (CD-ROM), for example. The computer readable media may also be any other volatile or non-volatile storage systems. The computer readable medium may be considered a computer readable storage medium, for example, or a tangible storage device. In addition, for the implementation and other processes and methods disclosed herein, each block in FIG. 8 may represent circuitry that is wired to perform the specific logical functions in the process.

The dry audio signal may be an audio signal received directly from an audio source. Additionally, or alternatively, the dry audio signal may be an audio signal processed by the audio playback device. In one example, the audio signal may be processed by an equalizer prior to being input to the DSF 800. In another example, the audio signal may be mixed with one or more audio sources prior to being input to the DSF 800. In yet another example, a uniform gain may be added to the audio signal to account for a volume setting prior to being input to the DSF 800 but before being amplified for output by a transducer. In the case of a cascade of DSFs 800, the dry audio signal may be an output of a prior DSF 800 in the cascade.

The wet audio signal may be the dry audio signal filtered by a filter 814. The filter 814 may have a gain reduction frequency response. For example, the frequency response may be dominated by a range of frequencies with less than unity gain (also known as a cutting region) and a remaining range of frequencies at or below unity. In some cases, the filter 814 may define a maximum gain reduction of the limiter. The filter 814 applied to the dry signal may take a variety of forms. For example, the filter 814 may be a fixed equalization filter (e.g., characteristics do not change over time) applied to the audio signal to filter the audio signal in a manner which is acoustically pleasing to a listener while conforming to the operational limit of the audio playback pipeline. The filter 814 may take the form of a finite impulse response filter (FIR), warped FIR, infinite impulse response filter (IIR), among other examples. The filter 814 may allow for the operational limit to be reached most readily in the low frequencies as volume increases. Then, as the volume continues to increase, a spectral balance of gain may change such that gain is increased for higher frequencies resulting in a perceived increase in loudness without the transducer exceeding operational limits.

Figure 9:
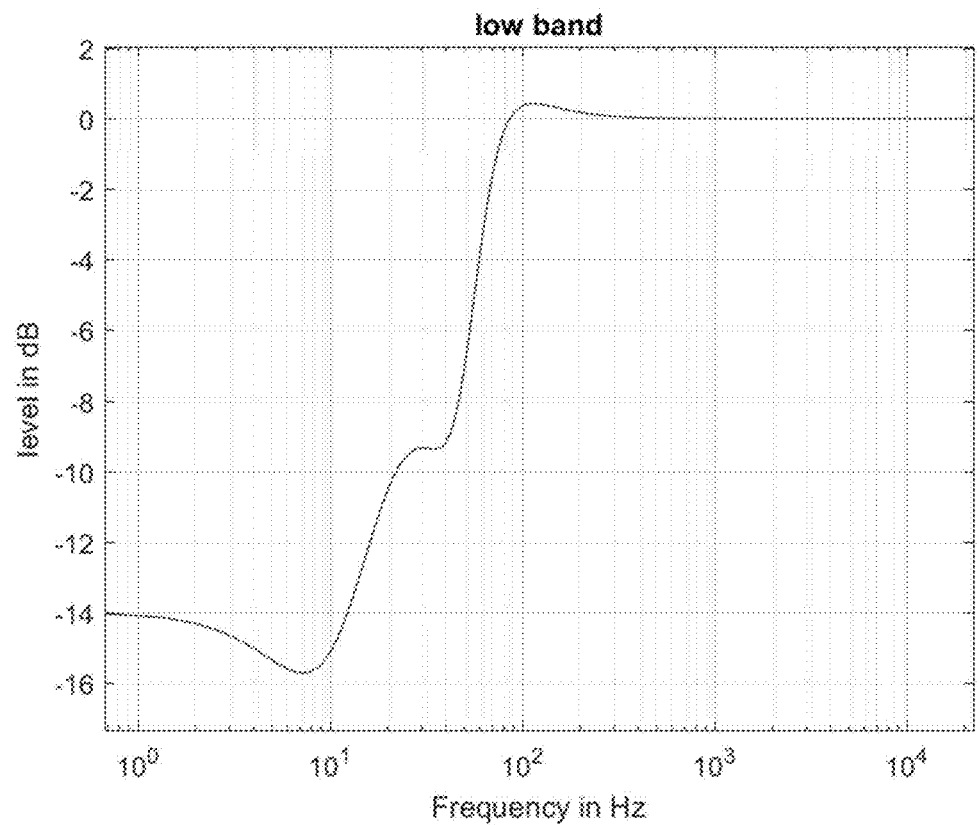
FIG. 9 shows an example of a low-band reduction filter.

FIG. 9 shows one example of this filter 814. The filter 814 may be a low band reduction filter which is applied to low frequency bands of the dry audio signal. For example, the low-band reduction filter may cover the 0 to 45 Hz range and attenuate the dry audio signal in the 0 to 10 Hz range which is typically not perceptible by a listener but may result in greatest reduction in excursions. In addition, the low-band reduction filter may have a frequency boost above a frequency threshold at which physical limits are less of a concern. In the example filter 814, the frequency threshold is 100 Hz. This frequency boost may provide tonal balance, adding upper-bass to replace reduced lower bass to balance audio for a listener across an entire frequency range. The low-band reduction filter may take a variety of other forms, including being further adjusted to fit physical and/or operational characteristics of the audio playback device on which its applied.

Figure 10:
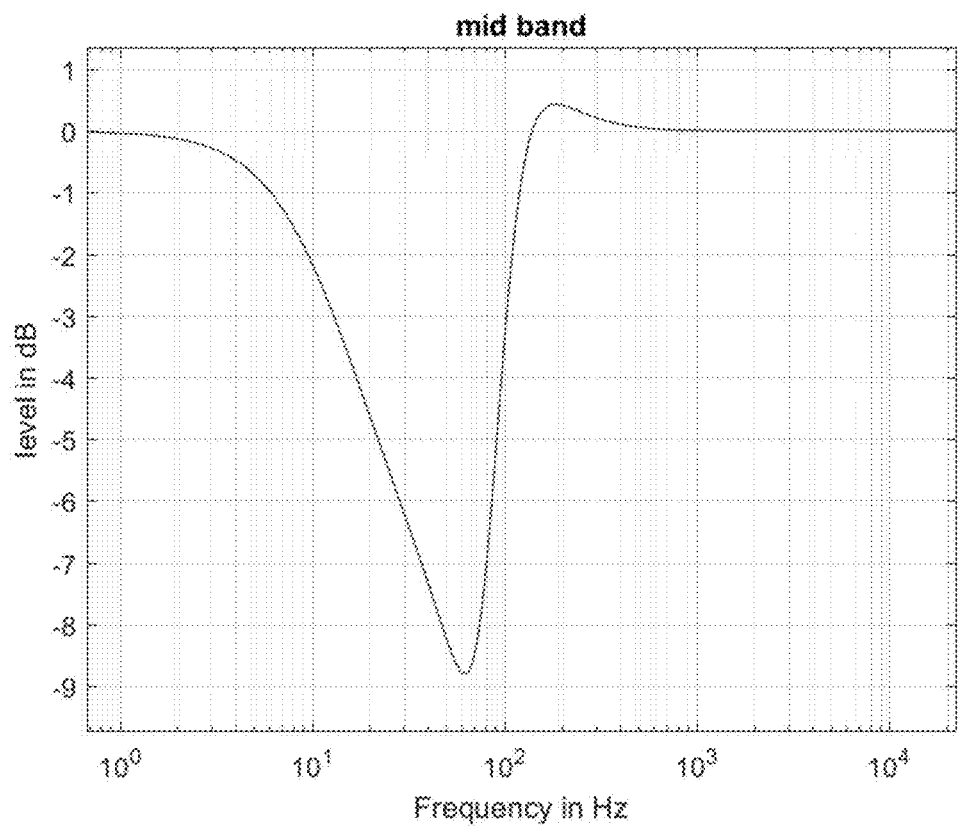
FIG. 10 shows an example of a mid-band reduction filter.

FIG. 10 shows a second example of this filter 814. The filter 814 may be a mid-band reduction filter. For example, the mid band reduction filter may cover a 0 to 100 Hz range and attenuate the dry audio signal in a 10 to 100 Hz range. The attenuation may be perceptible to a listener in this frequency range. The mid band filter may reduce excursions less than the low band filter. The mid band filter may have a frequency boost above a frequency threshold at which physical limits are less of a concern. The frequency boost may compensate for the attenuation. In the example filter, the frequency threshold is also 100 Hz. Like the low-band reduction filter, the mid-band reduction filter may take a variety of other forms, including being further adjusted to fit physical and/or operational characteristics of the audio playback device on which its applied.

Figure 11:
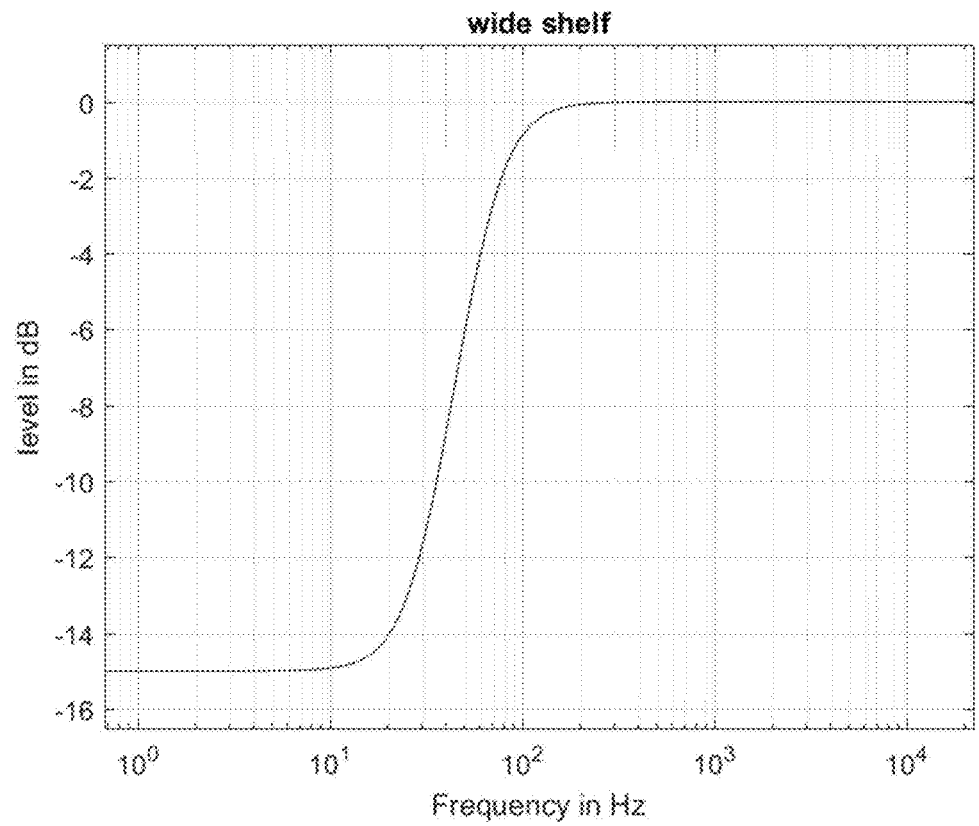
FIG. 11 shows an example of a wide-shelf reduction filter.

FIG. 11 shows a third example of this filter 814. The filter 814 may be a wide-shelf reduction filter. The wide band reduction filter may attenuate in a frequency range which overlaps the low-band and mid-band reduction filters to bring down amplitudes of a wide range of frequencies from 0 to 100 Hz. Like the mid band reduction filter, the attenuation may be perceptible to a listener. The wide-shelf reduction filter may not have any frequency boost. Like the low-band filter and the mid-band reduction filter, the wide shelf reduction filter may take a variety of other forms, including being further adjusted to fit physical and/or operational characteristics of the audio playback device on which its applied.

The DSF 800 may store in memory and/or request and/or receive from a network device an indication of operational limit of the audio playback device. The indication may take the form of a threshold 806. The threshold 806 may be indicative of a maximum signal output by the DSF 800. The threshold 806 may be the same across all frequencies of the dry signal input into the DSF 800.

Alternatively, the threshold 806 may be a performance ceiling response. The performance ceiling response may define a maximum signal output by the DSF 800 as a function of frequency so that the audio playback pipeline does not exceed the operational limit (e.g., conforming to excursion, voltage, current, or power limits). In one example, the performance ceiling response may define an operational limit in terms of an excursion limit of the audio playback device. In a second example, the performance ceiling response may define an operational limit in terms of a voltage limit of the audio playback device. In a third example, the performance ceiling response may define an operation limit in terms of a current limit of the audio playback device. In a fourth example, the performance ceiling response may define an operational limit in terms of a power limit of the audio playback device. In a fifth example, the performance ceiling response may define an operation limit in terms of an aggregation of one or more of the performance ceiling response associated with the excursion limit, voltage limit, current limit, power limit etc. For example, the performance ceiling response may define a minimum or maximum operation limit of one or more of the excursion limit, voltage limit, current limit, or power limit for a certain frequency or range of frequencies. Other variations are also possible.

The performance ceiling response may be determined during a testing of the audio playback pipeline and then made available to the DSF 800. The testing may be performed by a manufacturer of the audio playback device. For example, audio signals may be applied at different amplitudes and different frequencies to the audio playback pipeline to determine when an operational limit of the audio playback pipeline is reached, e.g., the playback device is damaged or about to be damaged. In the case of the playback device having multiple woofers, it is assumed that each woofer has a same volume displacement. The multiple woofers may be treated as one woofer with each woofer having a 1/n share of the volume displacement where n is the number of woofers for purposes of determining an operational limit. In the case of the playback device having multiple transducers, it is assumed that bass content is consolidated in a bass channel for purposes of determining an operational limit.

Alternatively, the performance ceiling response may be determined based on analyzing one or more physical models that describe operation of the audio playback device, e.g., audio playback pipeline, as a lumped circuit/mechanical system. The analysis may indicate what audio signals may be applied at different amplitudes and different frequencies to the audio playback pipeline to stay within an operational limit of the audio playback pipeline. The performance ceiling response may be determined in other ways as well.

The representation of the threshold 806 may be defined mathematically or numerically. The mathematical representation may take the form of one or more biquads, e.g., amplitude vs frequency representations, or equalizations. The numerical representation may take the form of a single threshold value, a plurality of threshold value, or one or more tables of values of amplitudes and corresponding frequencies.

An excess metric may be calculated to determine how much of the wet signal to mix with the dry signal so that the playback device operates within an operational limit. The excess metric may be an amplitude excess over the threshold 806 at every frequency or frequency band to be considered. The excess metric may be determined over a full spectrum or within a given frequency band such as 0 to 45 Hz when a low band filter is applied or 45-100 Hz when a mid-band filter is applied. Alternatively, the excess metric may be determined in a time domain, e.g., amplitude excess over the threshold 806 over a period of time.

Referring back to FIG. 8, the dry detector 808 may specifically compare an envelope of the dry signal with the threshold 806 at dry detector 808. To facilitate this process, the dry detector 808 may comprise a peak detector. In general, the peak detector may receive an audio signal as input and produce an envelope of the audio signal as output. The peak detector may compute an absolute value of the audio signal. The absolute value may be an absolute value of a sample of the audio signal. Alternatively, the absolute value may be an absolute value of a sum of samples of the audio signal, e.g., in one or more audio packets. The peak detector may set an envelope value to the absolute value if the absolute value exceeds a current envelope value and otherwise, decay the current envelope value. The decay may be represented by:

$$\text{new envelope value} = \text{current envelope value} * k \qquad \text{Eq1}$$

where k is a value less than one that causes the envelope to decay to a suitably small fraction within a few tens of milliseconds. Typical envelope detector parameters may place the decay rate to about 50 ms to reach 5 percent of the original value. As a result, the peak detector reconstructs the signal envelope by "bridging exponentially" across valleys in the audio signal.

The output of the comparison performed by the dry detection 808 may be a mathematical representation, e.g., biquad, or numerical representation of the amplitude of the envelope of the dry audio signal in excess of the threshold 806 to yield a dry excess. The dry excess may be a difference between the envelope of the dry audio signal and the threshold 806. The difference may be at specific time, a specific frequency, or over a range of time (e.g., over one or more packets) or a range of frequencies (in which case the differences may be integrated to define the dry excess). The dry excess may be represented as a positive quantity if the amplitude of the envelope of the dry audio signal is greater than the amplitude of the threshold 806. Conversely, the dry excess may be represented as a negative quantity if the envelope of the dry audio signal is less than the threshold.

Figure 12:
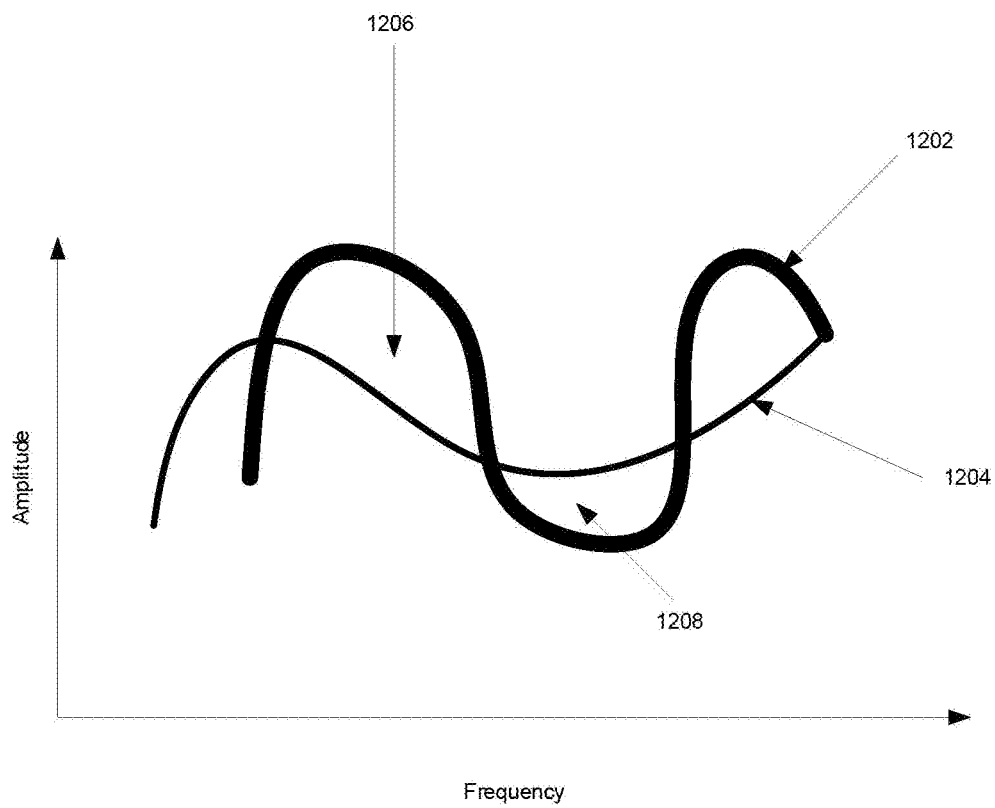
FIG. 12 shows an example comparison of a dry audio signal with a performance ceiling response associated with an audio playback pipeline.

FIG. 12 shows an example of the comparison of a performance ceiling response 1202 associated with an audio playback pipeline with an envelope of the dry audio signal 1204. A positive dry excess is shown as the area 1206 of the envelope of the dry audio signal 1204 which exceeds the performance ceiling response 1202. A negative dry excess is shown as the area 1208 of the envelope of the dry audio signal 1204 which is below the performance ceiling response 1202. The comparison of the envelope of the dry audio signal may be performed across an entire spectrum or at a given frequency band such as a low-band from 0 to 45 Hz or a mid-band from 45 to 100 Hz. The dry excess may be a maximum value between the performance ceiling response 1202 and the envelope of the dry audio signal 1204 within the frequency band within the frequency band or an integration of an area between the performance ceiling response 1202 and the envelope of the dry audio signal 1204 within the frequency band.

In some examples, the dry detector 808 may compare the envelope of the dry audio signal 1203 (e.g., dry envelope) to one or more different performance ceiling responses associated with different operational limits, e.g., excursion limits, voltage limits, current limits, etc. The dry detector 808 may output a maximum dry excess based on these comparisons. Other variations are also possible.

Similarly, the envelope of the wet signal may be compared to the threshold 806 at wet detector 810. An output of this comparison may be a mathematical representation or numerical representation of the envelope of the wet signal (e.g., wet envelope) in excess of the threshold 806 to yield a wet excess. In some examples, the threshold 806 associated with wet detector 810 and dry detector 808 may be identical to facilitate comparisons based on respective outputs by 808, 810, but they could be different. Further, the threshold 806 associated with wet detector 810 and dry detector 808 could be implemented as a single module which receives a dry and wet signal rather than separate modules as shown in FIG. 8.

In some examples, the wet detector 810 may compare the wet signal itself to the threshold 806 to determine the wet excess. In some examples, the dry detector 808 may compare the dry signal itself to the threshold 806 to determine the dry excess. This may be instead of comparing to the envelope of a wet/dry signal or in addition to comparing to the envelope of the wet/dry signal.

The DSF 800 may have a controller 816 (not to be confused with the controller device 300). The controller 816 may be hardware, software, or a combination of hardware and software to receive one or more of the wet excess, dry excess, wet envelope, dry envelope, and threshold 806 and determine how much the dry and wet signals are to be mixed at 812 to keep the playback device below an applicable operational limit while affecting the dry signal as little as possible. The amount of mixing may be based on a gain applied to the dry signal and a gain applied to the wet signal. For example, a proportion of 100% wet may indicate that the signal output by the DSF 800 is only the wet signal and a proportion is 0% wet may indicate that the signal output by the DSF 800 is only the dry signal. Any proportions in between may result in a blend of the wet signal and dry signal where the percentage of wet signal and dry signal equals 100%. Further, the filter 814 which is applied may be chosen so that there is a smooth progression between a 100% dry signal, intermediate choices of the wet signal and dry signal blend, and a 100% wet signal. The wide-shelf reduction filter is one example of such a filter which achieves this smooth progression.

In summary, the dry audio signal and the wet audio signal may generally be mixed in proportion to respective gains. Mathematically, this may be represented as:

$$\text{Mixed Signal} = \text{dry signal} * \text{gain of dry signal} + \text{wet signal} * \text{gain of wet signal} \qquad \text{Eq 2}$$

where gain of dry signal+gain of wet signal=1. The gains may be determined at a frequency or a range of frequencies.

In one example, if both the wet envelope and the dry envelope are below the threshold 806 (e.g., wet and dry excess is negative) for a given frequency or range of frequencies, then the gain applied to the dry signal may be one and the gain applied to the wet signal may be zero. This indicates that the dry signal itself will not cause the audio playback device, e.g., audio playback pipeline, to exceed the operational limit. Further, the wet signal, although not relevant to the output of the DSF 800, may be equal to or lower than the dry signal because the filter 814 applied to the dry signal generally has a frequency response with a gain at or below unity.

In a second example, if the wet envelope is below the threshold 806 (e.g., wet excess is negative) but the dry envelope is above the threshold for a frequency or range of frequencies, then the gain applied to the dry signal may be computed as:

$$\text{dryGain} = (\text{wetEnvelope} - \text{threshold}) / (\text{wetEnvelope} - \text{dryEnvelope}) \qquad \text{Eq. 3}$$

where the wetEnvelope may be a representation of the wet envelope and the dryEnvelope may be a representation of the dry envelope. The dryGain may be a representation of the gain to apply to the dry signal for a given frequency or range of frequencies to reduce an amplitude of the dry signal. The representation may be mathematical, e.g., a biquad, or numerical such as a table of values. WetGain may be computed as 1−dryGain.

Intuitively, the DSF 800 may have identified that the envelope of the dry signal (e.g., dry envelope) is above the threshold 806, and the envelope of the wet signal (e.g., wet envelope) is below the threshold 806. In this case, the dry excess is a positive value, the wet excess is not greater than zero, and correction of the dry excess is possible. Since the DSF 800 may strive to produce an output that does not exceed the threshold, a wet/dry proportion should be chosen that causes the output to be as high as it can be, while remaining below the threshold 806.

The equation dryGain=(wetEnvelope−threshold)/(wetEnvelope−dryEnvelope) which may achieve this result is derived as follows:

The wet gain and dry gain may be complements of each other adding up to one:

$$dryGain = 1 - wetGain \qquad \text{Eq 4}$$

As a result, the output of the limiter may be represented as:

$$Output = dryGain*drySignal + wetGain*wetSignal \qquad \text{Eq 5}$$

where the output is composed of the sum of wet signal and dry signal after applying respective gains.

Next, substitute eq4 into eq5:

$$Output = dryGain*drySignal + (1-dryGain)*wetSignal \qquad \text{Eq 6}$$

Because the envelopes of the wet and dry signals may be a suitable upper bound to what values they may reach, the envelope of the output of the DSF 800 may not exceed the sum of the envelopes of the inputs (the dry signal and the wet signals combined in some proportion to be determined).

Eq 6 may be rewritten in terms of the envelopes for the wet and dry signals. Given that the output envelope can reach the threshold:

$$threshold = dryGain*dryEnvelope + (1-dryGain)*wetEnvelope \qquad \text{Eq 7}$$

and dryGain is solved for:

$$0 = dryGain*dryEnvelope + wetEnvelope - dryGain*wetEnvelope - threshold$$

$$0 = dryGain(dryEnvelope - wetEnvelope) + wet - threshold$$

$$dryGain(wetEnvelope - dryEnvelope) = wet - threshold$$

$$dryGain = (wetEnvelope - threshold)(wetEnvelope - dryEnvelope) \qquad \text{Eq 8}$$

In a third example, both the wet envelope and the dry envelope may be above the threshold 806 for a given frequency or range of frequencies.

When both wet envelope and dry envelope are over the threshold 806 it could be for various reasons: For example, a frequency response of the dry signal coming in may be well within a frequency range that the filter 814 could reduce it. Alternatively, the frequency response of the dry signal may not be quite in that frequency range, and therefore attempting a correction would apply unnecessary response changes to the dry signal that still results in the output exceeding the threshold 806.

One metric to judge whether the dry signal may be reduced by using the wet signal is a ratio between the wet and dry signal envelopes (the ratio of the two peak detectors). A ratio may be chosen above which the dry signal is out of the range of viable gain reduction, and below which we consider the dry signal to be within the range of viable gain reduction. For example, a signal causing the wet/dry ratio to be 0.5 would have a spectrum that results in a total peak output reduction of 6 dB. It may be a design choice to decide whether to apply gain correction based on the wet/dry ratio.

A MWGR may be a minimum worthwhile gain reduction (MWGR) which facilitates making this decision. The DSF 800 may operate in that when both wet and dry envelopes exceed the threshold 806 and the wet/dry ratio remains under the MWGR, the wet and dry mix output by the DSF 800 may move toward full wet as an amplitude of the dry signal input increases (as long as the wet peak value remains under the threshold 806) but once the wet peak value reaches the threshold 806 the wet dry gain blend would in turn reach 100% wet (dryGain=0). And if the gain of the dry signal is increased such that now both the wet peak value and the dry peak value have exceeded the threshold 806, then in turn the wet/dry blend would effectively remain clipped at 100% wet.

On the other hand, the wet/dry ratio may exceed the value of MWGR. For example, the wet/dry peak detector ratio may be 1. This is the case for a dry signal whose spectral content is completely outside the range where the filter 814 can have any effect. In this scenario, the target for wet/dry gain should be 0% wet (dryGain=1) as the dry signal cannot be reduced appreciably.

For all ratios in between, the output of the DSF 800 may be calculated as a linear interpolation between a 100% wet signal and a 100% dry signal. On one extreme, the ratio is exactly at the MWGR, so a full wet gain is set as the target. On the other extreme the ratio is at 1, so a full dry gain is set at the target. The equation which would cause the dry gain to continuously change from full wet (dryGain=0) to full dry (dryGain=1) is:

$$dryGain = (wetEnvelope - dryEnvelope*MWGR)/(dryEnvelope - threshold) \qquad \text{Eq:9}$$

The dryGain may be a representation of the gain to apply to the dry signal for a given frequency or range of frequencies. Further, when the dryEnvelope equals the threshold, then the frequency limiter may output the dry signal. Still further, if the dryGain is greater than one, the dryGain is limited to one. The wetEnvelope and dryEnvelope may be a representation of the envelope of the wet signal and dry signal, respectively. Again, the representation may be mathematical, e.g., a biquad, or numerical such as a table of values. The dry gain may be constrained between 0 and 1. Further, the wetGain may be computed as 1−dryGain.

In summary, the output of the DSF 800 may be based on a mix of the dry signal and the wet signal, where the dry and wet signal may be each weighted from 0 to 1 and the sum of the weightings equals 1. This output may take the form of digital data such as one or more packets of audio samples or a table of numerical values, or an analog signal.

To illustrate, consider that a dry signal may be 10 dB above performance ceiling response in the form of an excursion threshold and a wet signal may be 2 dB (avg) below the excursion threshold in a frequency band such as 30-50 Hz. This means that a dry signal which is 10 dB above the excursion threshold may need to be reduced by 8 dB for the frequency band to exist below the threshold value. In this regard, ~80% of the wet signal will be mixed with ~20% of the dry signal. This mixed signal may be output by the DSF 800.

In some examples, the mixing may involve equalizing one or more of the dry signal and wet signal and adjusting a phase of the dry signal and/or wet signal.

In the case that the DSF 800 is performed "in the cloud" or by the controller, the mixed audio signal may be sent to the audio playback device for playback.

Figure 13:
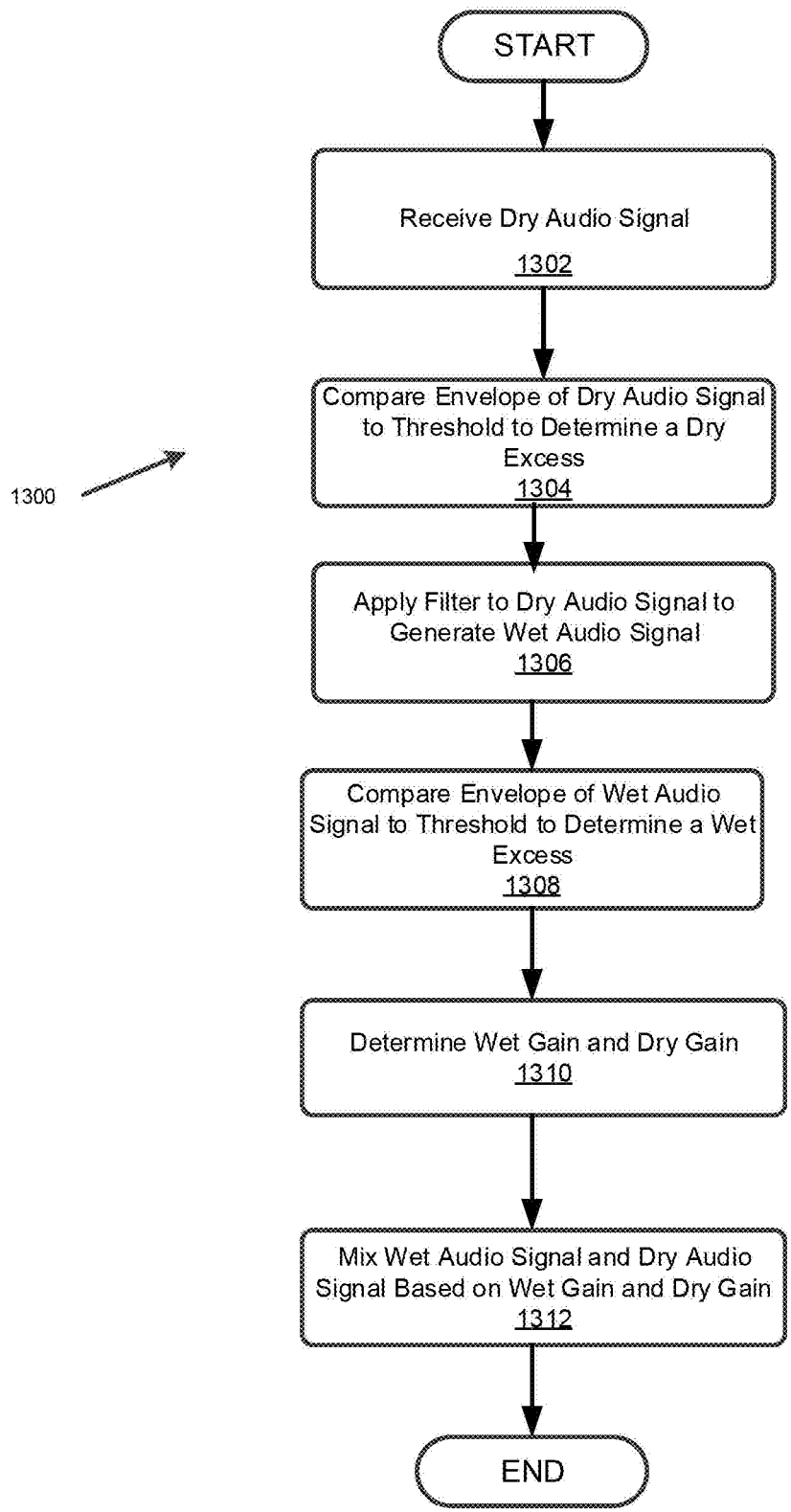
FIG. 13 shows a flow chart of functions associated with the example dynamic sidechain filter.

FIG. 13 is a flow chart of functions 1300 associated with the DSF. At 1302, an audio signal may be received. The audio signal may be a dry audio signal. At 1304, an envelope of the dry audio signal may be compared to a threshold of the playback device to determine a dry excess. In some examples, the threshold may take the form of the performance ceiling response. The performance ceiling response may represent physical, electrical, and/or thermal limits of the audio playback device, and more specifically the audio playback pipeline. At 1306, a filter may be applied to the audio signal to generate another audio signal. The other audio signal may be a wet audio signal. At 1308, an envelope of the wet audio signal may be compared to the threshold of the playback device to determine a wet excess. At 1310, based on the dry and wet excess, a dry gain may be determined for the dry audio signal and a wet gain may be determined for the wet audio signal. The gains may be determined based on whether an envelope of the dry signal and/or wet signal are above or below the threshold. At 1312, the wet audio signal and the dry audio signals may be mixed in proportion to respective gains to output a mixed audio signal.

In some examples, parameters associated with the filter that is applied may change as a function of the dry gain and/or wet gain. For example, a quality factor (Q) of the filter may be adjusted as the dry gain ranges from 0 to 1 such that as dry gain approaches 1, the Q factor may decrease. The adjustment of the filter may result in effect of the filtering being less perceptible as the signal output by the limiter approaches a 100% dry signal. Other parameters may also be varied such as bandwidth and/or cutoff frequency.

Figure 14:
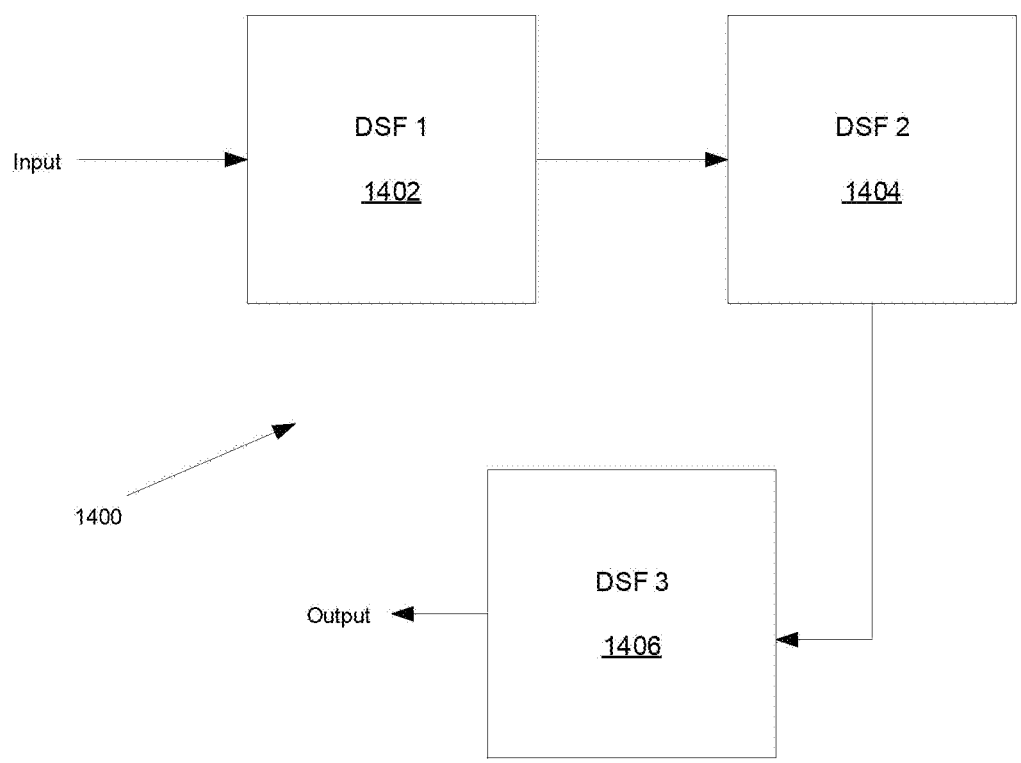
FIG. 14 shows an example arrangement of a limiter.

FIG. 14 shows an example of the plurality of DSFs 1400 arranged in an audio playback environment. In this arrangement, two or more DSFs may be cascaded together to act as a limiter. For example, DSF 1402, DSF 1404, and DSF 1406 may be cascaded together, but more or less DSFs may be cascaded together than what is illustrated. DSF 1402 may receive an audio signal, process the audio signal, and output an audio signal to DSF 1404. In turn, DSF 1404 may receive the audio signal output by DSF 1402 (e.g., mixed audio signal) and output an audio signal. In turn, DSF 1406 may receive the audio signal output by DSF 1404 and output an audio signal. This process may be repeated by one or more DSFs until the audio signal output by the limiter is input into the audio playback pipeline for playback.

In one example, each DSF 1402, 1404, 1406 may apply a different filter and/or in a particular order. The order in which the filters are applied in each DSF may be chosen such that amplitudes associated with a frequency range that has larger impact on whether the audio playback device stays within operational limits is reduced earlier in the cascade.

For example, DSF 1402 may apply the low band reduction filter, DSF 1404 may apply the mid band reduction filter, and DSF 1406 may apply the wide band reduction filter. The low band reduction filter may be applied first because an operational limit of the audio playback device tends to be reached more readily at low frequencies with minimal perception, e.g., physical limits may be reached most readily at low frequencies which require large transducer movements. By applying the low band reduction filter first, an amplitude of the audio signal may be reduced in a frequency range that yields a greatest savings in operating excursion. Then, for example, the mid-band reduction filter may catch excursions not caught by the low band reduction filter. In turn, the wide-shelf filter may catch any excursions not caught by the low-band reduction filter and the mid-band reduction filter. In other words, filters which cause less perceived bass loss may be applied earlier in the cascade followed by filters which cause more perceived bass loss later in the cascade of DSFs.

In another example, each DSF 1402, 1404, 1406 may additionally, or alternatively apply a certain performance ceiling response. For example, DSF 1402 may apply a performance ceiling response associated with an excursion limit and DSF 1404 may apply a performance ceiling response associated with a voltage limit. The cascade may facilitate applying multiple performance ceiling responses to the dry signal rather than applying an aggregated performance ceiling response that incorporates operational limits associated with one or more of excursion limits, voltage limits, current limits, etc.

In some embodiments, a single instance of the DSF may be used to apply a plurality of filters rather than each DSF applying a filter in cascade. In this case, the single DSF may act as a limiter.

For example, each filter, e.g., low-band, mid-band, and wide-shelf, may be applied to a full spectrum e.g., 0 Hz to 22,050 Hz, of the dry signal to produce a corresponding wet signal at 806. Then, at 806, the corresponding wet signals may be combined to produce a combined wet signal from which a wet excess can determined in accordance with the functions described with respect to FIGS. 8 and 13. For example, the corresponding wet signals may be averaged together to produce a single wet signal. In this regard, a single instance of the DSF may be used to apply a plurality of filters to a dry audio signal.

In another example, a plurality of filters may be combined and applied to a full spectrum e.g., 0 Hz to 22,050 Hz, of the dry signal yielding a wet signal at 806. For example, the low and mid band reduction filters may be combined e.g., convolved, summed, averaged, and/or multiplied, with the mid band reduction filter to produce a combined filter to catch most excursions in excess of the operational limit. Then, the wide shelf may be combined to catch any excursions that the low and mid band reduction filters missed. The combined filter may be applied to the dry audio signal at 806. In this regard, a single instance of the DSF may be used to apply a plurality of filters to a dry audio signal.

A playback environment may have one or more audio playback devices playing back audio. All or a subset of the audio playback devices may apply the described limiting. In some examples, the filters used in one or more DSFs for each audio playback device may be the same. In other examples, the filters used in one or more DSFs for each audio playback device may be different because each audio playback device may play different spectral content. In this regard, the spectral content played by an audio playback device may determine the filters used in one or more DSFs and an order by which the filters are applied via a cascade of DSFs.

For example, an audio playback device arranged as a subwoofer may output low frequency content in a range of 20 to 200 Hz while other audio playback devices playing audio in synchrony with the subwoofer may output audio content in a range of 200 Hz to 22,050 Hz. In this regard, a low-band reduction filter may only be used in the DSF for the other audio playback devices in this arrangement because there is less of a chance of operational limits being reached because the audio playback device arranged as a subwoofer is playing low frequency content. The low-band reduction filter may be sufficient to avoid the other audio playback devices exceeding the operational limits. However, one or more filters, e.g., the low-band, mid-band, and wide shelf, may be used in a DSF or a cascade of DSFs for the audio playback device arranged as a subwoofer. Other variations are also possible.

Additionally, or alternatively, the filters used in the one or more DSFs for an audio playback device arranged as a subwoofer may differ from the filters used in the one or more DSFs for other audio playback devices not arranged as a subwoofer. The filters may differ because the performance ceiling responses in the devices differ. For example, the audio playback device arranged as a subwoofer may have a higher performance ceiling response as compared to an audio playback device not arranged as a subwoofer. This is because the audio playback device arranged as a subwoofer is designed to output more low frequency content as compared to an audio playback device not arranged as a subwoofer. As a result, the filters used in the one or more DSFs for the audio playback device arranged as a subwoofer may have different characteristics, e.g., less attenuation, lower cutoff, from the filters used by the one or more DSFs for the audio playback device not arranged as a subwoofer.

The filters used in the one or more DSFs may also depend on whether the content is played by one audio playback device or a plurality of audio playback devices. For example, a plurality of audio playback devices may play audio in stereo or synchronously play audio in a home theater environment. In these arrangements, the low frequency content may be distributed and played back among the plurality of audio playback devices. The amount of limiting needed in this case may be less, e.g., less gain reduction, than if one or a few audio playback devices are playing the audio. In turn, the filters used in the one or more DSFs of the plurality of audio playback devices playing audio may differ from when one or a few audio playback devices are playing the audio in stereo or in synchrony in a home theater environment.

In other embodiments, the DSF may not apply a filter to a full spectrum of the dry audio signal, e.g., 0 Hz to 22,050 Hz. Instead, the DSF may apply the filter to a band of the dry audio signal less than a full spectrum. By applying the filter to less than a full spectrum, buffer requirements may be lessened. For example, the filter, e.g., low-band, mid-band, or wide shelf, may be separately applied to the 0-20 Hz band, the 20-50 Hz band, and the 50-100 Hz band of the dry audio signal. Band wise methods may reduce buffer requirements since a smaller spectrum is processed by the audio playback device at a time at an expense of increased latency.

In one example, each application of the filter may produce a corresponding wet signal for the dry signal for a respective band. The wet signals for each band may be combined to generate a wet signal for the plurality of bands, and then this wet signal and the dry signal may be used to determine a wet gain and dry gain and the mixed signal for the plurality of bands. In another example, after applying the filter to each band, the wet gain and dry gain for each band may be calculated, and a mixed signal calculated for each band. The mixed signal for each band may be then combined to generate a mixed signal for the plurality of bands. In this embodiment, the DSF may apply a filtering between bands of the mixed signals to smooth transition of the mixed signal between bands.

In another example, a plurality of filters may be combined and then applied by the DSF to each band of the dry signal, yielding a corresponding wet signal. For example, the low-band reduction filter may be combined, e.g., convolved, averaged, summed, and/or multiplied, with the mid-band reduction filter to produce the combined filter. Then, the combined filter may be separately applied to the 0-20 Hz band, then 20-50 Hz band, and then 50-100 Hz band of the dry audio signal as described above.

In yet another example, each DSF in a cascade of DSFs may apply a filter which filters in a certain band. For example, a first DSF may apply a filter covering a 0-20 Hz band and a second DSF may apply a filter covering a 20-50 Hz band. The respective wet signal may be used to determine a mixing of the wet and dry signal at each instance of the DSF. To illustrate, a dry signal may be 8 dB above the threshold in the 20-50 Hz range; a first wet signal in the first DSF may be 2 dB below the threshold in a 20-30 Hz range; and a second wet signal in the second DSF may be 1 dB below the threshold in the 30-50 Hz range. In this case, the first wet signal may be more heavily mixed than the second wet signal. Other variations are also possible.

Further, examples describe a DSF which takes as input an audio signal and outputs a mixed audio signal. The DSF may be associated with other sidechains associated with audio playback including in the frequency domain (expander, compressor, etc.) or in the time domain (reverb, delay, etc.) besides just acting as a limiter.

IV. Conclusion

The description above discloses, among other things, various example systems, methods, apparatus, and articles of manufacture including, among other components, firmware and/or software executed on hardware. It is understood that such examples are merely illustrative and should not be considered as limiting. For example, it is contemplated that any or all of the firmware, hardware, and/or software aspects or components can be embodied exclusively in hardware, exclusively in software, exclusively in firmware, or in any combination of hardware, software, and/or firmware. Accordingly, the examples provided are not the only way(s) to implement such systems, methods, apparatus, and/or articles of manufacture.

Additionally, references herein to "embodiment" means that a particular feature, structure, or characteristic described in connection with the embodiment can be included in at least one example embodiment of an invention. The appearances of this phrase in various places in the specification are not necessarily all referring to the same embodiment, nor are separate or alternative embodiments mutually exclusive of other embodiments. As such, the embodiments described herein, explicitly and implicitly understood by one skilled in the art, can be combined with other embodiments.

The specification is presented largely in terms of illustrative environments, systems, procedures, steps, logic blocks, processing, and other symbolic representations that directly or indirectly resemble the operations of data processing devices coupled to networks. These process descriptions and representations are typically used by those skilled in the art to most effectively convey the substance of their work to others skilled in the art. Numerous specific details are set forth to provide a thorough understanding of the present disclosure. However, it is understood to those skilled in the art that certain embodiments of the present disclosure can be practiced without certain, specific details. In other instances, well known methods, procedures, components, and circuitry have not been described in detail to avoid unnecessarily obscuring aspects of the embodiments. Accordingly, the scope of the present disclosure is defined by the appended claims rather than the forgoing description of embodiments.

When any of the appended claims are read to cover a purely software and/or firmware implementation, at least one of the elements in at least one example is hereby expressly defined to include a tangible, non-transitory medium such as a memory, DVD, CD, Blu-ray, and so on, storing the software and/or firmware.

The invention claimed is:

1. A playback device comprising:
at least one transducer;
at least one processor;
at least one non-transitory computer-readable medium; and
program instructions stored on the at least one non-transitory computer-readable medium that are executable by the at least one processor such that the playback device is configured to:
receive a first audio signal;
predict a first level of excursion of the at least one transducer resulting from playing back the first audio signal;
determine that the predicted first level of excursion exceeds a threshold amount of excursion of the at least one transducer;
based on determining that the predicted first level of excursion exceeds the threshold amount of excursion, apply a filter to the first audio signal to generate a second audio signal;
predict a second level of excursion of the at least one transducer resulting from playing back the second audio signal;
determine that the predicted second level of excursion is below the threshold amount of excursion;
based on determining that the predicted second level of excursion is below the threshold amount of excursion, mix the first audio signal and the second audio signal to determine a mixed signal; and
cause playback of audio based on the mixed signal.

2. The playback device of claim 1, wherein the program instructions that are executable by the at least one processor such that the playback device is configured to apply the filter to the first audio signal to generate the second audio signal comprise program instructions that are executable by the at least one processor such that the playback device is configured to attenuate an amplitude of the first audio signal in a frequency range.

3. The playback device of claim 1, wherein the program instructions that are executable by the at least one processor such that the playback device is configured to mix the first audio signal and the second audio signal comprise program instructions that are executable by the at least one processor such that the playback device is configured to mix the first audio signal and the second audio signal at a ratio that causes a third level of excursion of the at least one transducer that is predicted to result from playing back the mixed signal to be less than or equal to the threshold amount of excursion.

4. The playback device of claim 1, wherein the program instructions that are executable by the at least one processor such that the playback device is configured to mix the first audio signal and the second audio signal comprise program instructions that are executable by the at least one processor such that the playback device is configured to mix the first audio signal and the second audio signal at a ratio that causes a maximum level of excursion of the at least one transducer that may result from playing back the mixed signal to be less than or equal to the threshold amount of excursion.

5. The playback device of claim 1, wherein the program instructions that are executable by the at least one processor such that the playback device is configured to predict the first level of excursion comprise program instructions that are executable by the at least one processor such that the playback device is configured to detect a current or voltage of the first audio signal, and wherein the program instructions that are executable by the at least one processor such that the playback device is configured to predict the second level of excursion comprise program instructions that are executable by the at least one processor such that the playback device is configured to detect a current or voltage of the second audio signal.

6. The playback device of claim 5, wherein the program instructions that are executable by the at least one processor such that the playback device is configured to determine that the first predicted level of excursion exceeds the threshold amount of excursion comprise program instructions that are executable by the at least one processor such that the playback device is configured to compare a maximum current or voltage of the first audio signal to a threshold current or voltage of the first audio signal, and wherein the program instructions that are executable by the at least one processor such that the playback device is configured to determine that the second predicted level of excursion is below the threshold amount of excursion comprise program instructions that are executable by the at least one processor such that the playback device is configured to compare a maximum current or voltage of the second audio signal to a threshold current or voltage of the second audio signal.

7. The playback device of claim 1, wherein the program instructions that are executable by the at least one processor such that the playback device is configured to apply the filter to the first audio signal to generate the second audio signal comprise program instructions that are executable by the at least one processor such that the playback device is configured to apply the filter to a first band of the first audio signal and then apply the filter to a second band of the first audio signal, wherein the first band and second band are non-overlapping frequency bands.

8. A non-transitory computer-readable medium, wherein the non-transitory computer-readable medium is provisioned with program instructions that, when executed by at least one processor, cause a playback device to:
receive a first audio signal;
predict a first level of excursion of at least one transducer of the playback device resulting from playing back the first audio signal;
determine that the predicted first level of excursion exceeds a threshold amount of excursion of the at least one transducer;
based on determining that the predicted first level of excursion exceeds the threshold amount of excursion, apply a filter to the first audio signal to generate a second audio signal;
predict a second level of excursion of the at least one transducer resulting from playing back the second audio signal;
determine that the predicted second level of excursion is below the threshold amount of excursion;
based on determining that the predicted second level of excursion is below the threshold amount of excursion, mix the first audio signal and the second audio signal to determine a mixed signal; and
cause playback of audio based on the mixed signal.

9. The non-transitory computer-readable medium of claim 8, wherein the program instructions that, when executed by at least one processor, cause the playback device to apply the filter to the first audio signal to generate the second audio signal comprise program instructions that, when executed by at least one processor, cause the playback device to attenuate an amplitude of the first audio signal in a frequency range.

10. The non-transitory computer-readable medium of claim 8, wherein the program instructions that, when executed by at least one processor, cause the playback device to mix the first audio signal and the second audio signal comprise program instructions that, when executed by at least one processor, cause the playback device to mix the first audio signal and the second audio signal at a ratio that causes a third level of excursion of the at least one transducer that is predicted to result from playing back the mixed signal to be less than or equal to the threshold amount of excursion.

11. The non-transitory computer-readable medium of claim 8, wherein the program instructions that, when executed by at least one processor, cause the playback device to mix the first audio signal and the second audio signal comprise program instructions that, when executed by at least one processor, cause the playback device to mix the first audio signal and the second audio signal at a ratio that causes a maximum level of excursion of the at least one transducer that may result from playing back the mixed signal to be less than or equal to the threshold amount of excursion.

12. The non-transitory computer-readable medium of claim 8, wherein the program instructions that, when executed by at least one processor, cause the playback device to predict the first level of excursion comprise program instructions that, when executed by at least one processor, cause the playback device to detect a current or voltage of the first audio signal, and wherein the program instructions that, when executed by at least one processor, cause the playback device to predict the second level of excursion comprise program instructions that, when executed by at least one processor, cause the playback device to detect a current or voltage of the second audio signal.

13. The non-transitory computer-readable medium of claim 12, wherein the program instructions that, when executed by at least one processor, cause the playback device to determine that the first predicted level of excursion exceeds the threshold amount of excursion comprise program instructions that, when executed by at least one processor, cause the playback device to compare a maximum current or voltage of the first audio signal to a threshold current or voltage of the first audio signal, and wherein the program instructions that, when executed by at least one processor, cause the playback device to determine that the second predicted level of excursion is below the threshold amount of excursion comprise program instructions that, when executed by at least one processor, cause the playback device to compare a maximum current or voltage of the second audio signal to a threshold current or voltage of the second audio signal.

14. The non-transitory computer-readable medium of claim 8, wherein the program instructions that, when executed by at least one processor, cause the playback device to apply the filter to the first audio signal to generate the second audio signal comprise program instructions that, when executed by at least one processor, cause the playback device to apply the filter to a first band of the first audio signal and then apply the filter to a second band of the first audio signal, wherein the first band and second band are non-overlapping frequency bands.

15. A method implemented by a playback device, the method comprising:
receiving a first audio signal;
predicting a first level of excursion of at least one transducer of the playback device resulting from playing back the first audio signal;
determining that the predicted first level of excursion exceeds a threshold amount of excursion of the at least one transducer;
based on determining that the predicted first level of excursion exceeds the threshold amount of excursion, applying a filter to the first audio signal to generate a second audio signal;
predicting a second level of excursion of the at least one transducer resulting from playing back the second audio signal;
determining that the predicted second level of excursion is below the threshold amount of excursion;
based on determining that the predicted second level of excursion is below the threshold amount of excursion, mixing the first audio signal and the second audio signal to determine a mixed signal; and
causing playback of audio based on the mixed signal.

16. The method of claim 15, wherein applying the filter to the first audio signal to generate the second audio signal comprises attenuating an amplitude of the first audio signal in a frequency range.

17. The method of claim 15, wherein mixing the first audio signal and the second audio signal comprises mixing the first audio signal and the second audio signal at a ratio that causes a third level of excursion of the at least one transducer that is predicted to result from playing back the mixed signal to be less than or equal to the threshold amount of excursion.

18. The method of claim 15, wherein mixing the first audio signal and the second audio signal comprises mixing the first audio signal and the second audio signal at a ratio that causes a maximum level of excursion of the at least one transducer that may result from playing back the mixed signal to be less than or equal to the threshold amount of excursion.

19. The method of claim 15, wherein predicting the first level of excursion comprises detecting a current or voltage of the first audio signal, and wherein predicting the second level of excursion comprises detecting a current or voltage of the second audio signal.

20. The method of claim 19, wherein determining that the first predicted level of excursion exceeds the threshold amount of excursion comprises comparing a maximum current or voltage of the first audio signal to a threshold current or voltage of the first audio signal, and wherein determining that the second predicted level of excursion is below the threshold amount of excursion comprises comparing a maximum current or voltage of the second audio signal to a threshold current or voltage of the second audio signal.

* * * * *